US012581734B2

(12) United States Patent
Jeon et al.

(10) Patent No.: US 12,581,734 B2
(45) Date of Patent: Mar. 17, 2026

(54) DISPLAY APPARATUS AND ELECTRONIC APPARATUS

(71) Applicant: Samsung Display Co., Ltd., Yongin-si (KR)

(72) Inventors: Joohee Jeon, Yongin-si (KR); Bokwang Song, Yongin-si (KR); Jieun Kim, Yongin-si (KR); Sanghee Jang, Yongin-si (KR); Gunhee Kim, Yongin-si (KR); Sanghwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 465 days.

(21) Appl. No.: 17/335,562

(22) Filed: Jun. 1, 2021

(65) Prior Publication Data

US 2021/0376279 A1 Dec. 2, 2021

(30) Foreign Application Priority Data

Jun. 1, 2020 (KR) ........................ 10-2020-0066028

(51) Int. Cl.
*H10K 59/126* (2023.01)
*H10D 86/40* (2025.01)
(Continued)

(52) U.S. Cl.
CPC ......... *H10D 86/481* (2025.01); *H10K 59/122* (2023.02); *H10K 59/131* (2023.02);
(Continued)

(58) Field of Classification Search
CPC ........... H01L 29/6653; H01L 29/66545; H01L 29/6656; H01L 29/66553
See application file for complete search history.

(56) References Cited

U.S. PATENT DOCUMENTS 4,117,210 A * 9/1978 Deb ........................ H01G 9/20
429/111
9,306,190 B2 4/2016 Kim et al.
(Continued)

FOREIGN PATENT DOCUMENTS

EP 3739632 A2 * 11/2020 .......... H01L 27/3211
KR 10-2016-0021330 2/2016
(Continued)

*Primary Examiner* — Chad M Dicke
*Assistant Examiner* — Valerie N Newton
(74) *Attorney, Agent, or Firm* — Harness, Dickey & Pierce, P.L.C.

(57) ABSTRACT

A display apparatus includes a substrate, a main pixel circuit, a main display element, an auxiliary pixel circuit, an auxiliary display element, a first bottom metal layer, a second bottom metal layer, and a first barrier layer. The substrate includes a main display area and a component area including a transmission area. The main pixel circuit and the main display element are arranged in the main display area. The auxiliary pixel circuit and the auxiliary display element are arranged in the component area. A first bottom metal layer is arranged between the substrate and the auxiliary pixel circuit in the component area. The second bottom metal layer is arranged between the first bottom metal layer and the auxiliary pixel circuit in the component area. The first barrier layer is arranged between the first bottom metal layer and the second bottom metal layer.

20 Claims, 20 Drawing Sheets

(51) Int. Cl.

| | |
|---|---|
| *H10K 59/122* | (2023.01) |
| *H10K 59/123* | (2023.01) |
| *H10K 59/131* | (2023.01) |
| *H10K 59/65* | (2023.01) |
| *H10K 59/80* | (2023.01) |
| *H10K 102/00* | (2023.01) |

(52) U.S. Cl.
CPC ........... *H10K 59/65* (2023.02); *H10K 59/878* (2023.02); *H10K 2102/351* (2023.02)

(56) References Cited

U.S. PATENT DOCUMENTS

| | | | |
|---|---|---|---|
| 9,911,941 B2 | 3/2018 | Choi et al. | |
| 2001/0046011 A1* | 11/2001 | Yasukawa | G02F 1/13454 |
| | | | 348/E9.027 |
| 2005/0007512 A1* | 1/2005 | Matsunaga | H01L 29/66757 |
| | | | 257/E27.111 |
| 2008/0193747 A1* | 8/2008 | MacDonald | H05K 3/0011 |
| | | | 204/192.12 |
| 2009/0117704 A1* | 5/2009 | Yamazaki | H01L 21/76254 |
| | | | 257/E21.568 |
| 2012/0074435 A1* | 3/2012 | Ha | H10K 50/805 |
| | | | 257/E33.012 |
| 2012/0200546 A1* | 8/2012 | Miyamoto | G02F 1/13338 |
| | | | 257/66 |
| 2015/0236280 A1* | 8/2015 | Sakuishi | H10K 71/80 |
| | | | 156/247 |
| 2017/0123250 A1* | 5/2017 | Wada | H01L 29/78633 |
| 2017/0345850 A1* | 11/2017 | Lee | C09D 7/61 |
| 2018/0157098 A1* | 6/2018 | Choung | G02F 1/133621 |
| 2020/0089037 A1* | 3/2020 | Yoshino | G02F 1/13624 |
| 2020/0168691 A1* | 5/2020 | Choi | H10K 59/40 |
| 2021/0028252 A1 | 1/2021 | Hong et al. | |
| 2022/0020835 A1* | 1/2022 | Choi | H10K 59/124 |

FOREIGN PATENT DOCUMENTS

| | | |
|---|---|---|
| KR | 10-2016-0130042 | 11/2016 |
| KR | 10-2017-0079927 | 7/2017 |
| KR | 10-2018-0074260 | 7/2018 |
| KR | 10-2021-0013500 | 2/2021 |

* cited by examiner

DISPLAY APPARATUS AND ELECTRONIC APPARATUS

CROSS-REFERENCE TO RELATED APPLICATIONS

This application claims priority to and the benefit of Korean Patent Application No. 10-2020-0066028, filed Jun. 1, 2020, which is hereby incorporated by reference for all purposes as if fully set forth herein.

BACKGROUND

Field

One or more embodiments generally relate to a display apparatus and an electronic apparatus including the same.

Discussion

Display apparatuses are used for various purposes. Also, as display apparatuses have become thinner and lighter, their range of use has widened. As display apparatuses are used in various ways, various methods may be used to design the shapes of display apparatuses, and further, more and more functions may be combined or associated with display apparatuses.

The above information disclosed in this section is only for understanding the background of the inventive concepts, and, therefore, may contain information that does not form prior art.

SUMMARY

One or more embodiments provide a display apparatus in which a display area is extended such that an image is capable of being displayed in an area where a component is arranged as an electronic element.

Additional aspects will be set forth in the detailed description which follows, and, in part, will be apparent from the disclosure, or may be learned by practice of the inventive concepts.

According to an embodiment, a display apparatus includes a substrate, a main pixel circuit, a main display element, an auxiliary pixel circuit, an auxiliary display element, a first bottom metal layer, a second bottom metal layer, and a first barrier layer. The substrate includes a main display area and a component area including a transmission area. The main pixel circuit and the main display element are arranged in the main display area. The auxiliary pixel circuit and the auxiliary display element are arranged in the component area. A first bottom metal layer is arranged between the substrate and the auxiliary pixel circuit in the component area. The second bottom metal layer is arranged between the first bottom metal layer and the auxiliary pixel circuit in the component area. The first barrier layer is arranged between the first bottom metal layer and the second bottom metal layer.

According to an embodiment, an electronic apparatus includes a display apparatus and a component. The display apparatus includes a main display area and a component area, the component area including a transmission area. The component overlaps the component area. The display apparatus includes a main pixel circuit, a main display element, an auxiliary pixel circuit, an auxiliary display element, a first bottom metal layer, a second bottom metal layer, and a first barrier layer. The main pixel circuit and the main display element are arranged in the main display area. The auxiliary pixel circuit and the auxiliary display element are arranged in the component area. A first bottom metal layer is arranged between the substrate and the auxiliary pixel circuit in the component area. The second bottom metal layer is arranged between the first bottom metal layer and the auxiliary pixel circuit in the component area. The first barrier layer is arranged between the first bottom metal layer and the second bottom metal layer.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings:

FIGS. 15, 16, 17, 18, 19, and 20 are respective cross-sectional views schematically illustrating a display apparatus at various stages of manufacture according to some embodiments.

DETAILED DESCRIPTION OF SOME EMBODIMENTS

Figure 1:
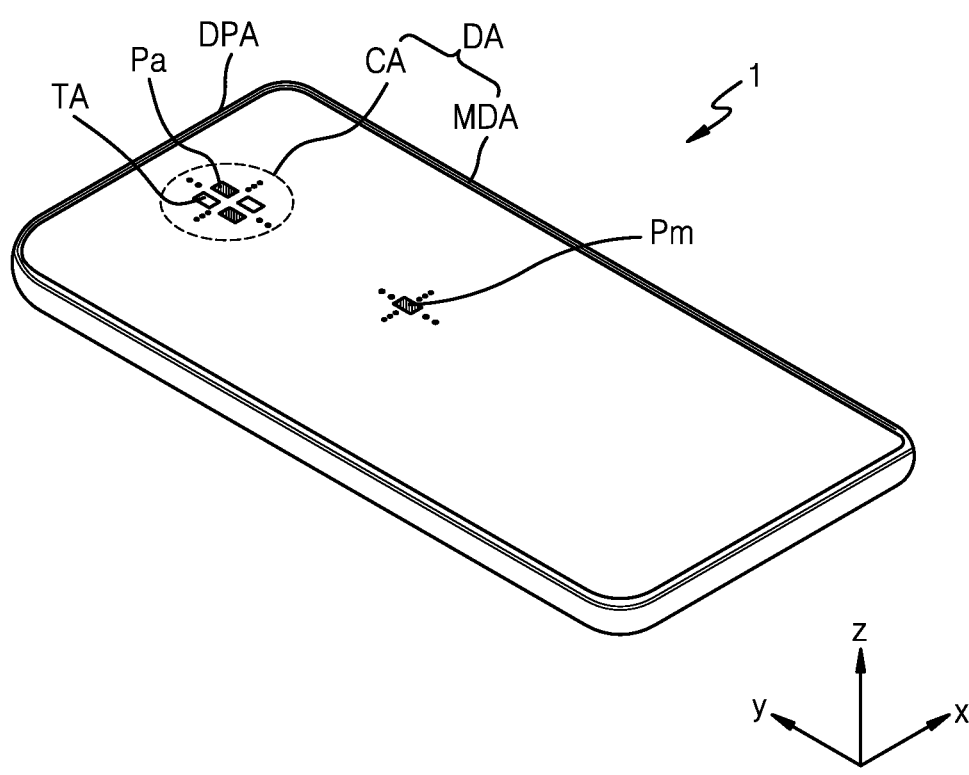
FIG. 1 is a perspective view schematically illustrating a display apparatus according to an embodiment.

In the following description, for the purposes of explanation, numerous specific details are set forth to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection.

In addition, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. Further, the meaning of a line "extending in a first direction or a second direction" may include not only extending in a linear shape, but also extending in a zigzag or curved shape along the first direction or the second direction.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly. Moreover, when a target portion is referred to as being "in a plan view," it may mean that the target portion is viewed from above, and when referred to as being "in a cross-sectional view," it may mean that a cross-section of a target portion vertically cut is viewed from a side. Additionally, when referred to as "overlapping," it may include overlapping "in a plan view" and overlapping "in a cross-sectional view."

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

FIG. 1 is a perspective view schematically illustrating a display apparatus according to an embodiment.

Referring to FIG. 1, a display apparatus 1 may include a display area DA and a peripheral area DPA outside the display area DA. The display area DA may include a component area CA and a main display area MDA at least partially surrounding the component area CA. For instance, each of the component area CA and the main display area MDA may display an image individually or together. The peripheral area DPA may be a type of non-display area in which display elements are not arranged. The display area DA may be surrounded, e.g., entirely surrounded, by the peripheral area DPA.

FIG. 1 illustrates one component area CA located in the main display area MDA. In an embodiment, the display apparatus 1 may include two or more component areas CA and the shapes and sizes of component areas CA may be different from each other. When viewed in a direction substantially perpendicular to the top surface of the display apparatus 1, the component area CA may have various shapes, such as circular shapes, elliptical shapes, polygonal shapes, e.g., tetragonal shapes, star shapes, diamond shapes, etc. Also, FIG. 1 illustrates that the component area CA is arranged at the upper center (in the +y direction) of the main display area MDA having a substantially rectangular shape when viewed in a direction substantially perpendicular to the top surface of the display apparatus 1; however, the component area CA may be arranged at one side of the main display area MDA having a rectangular shape, for example, at the upper right side or the upper left side thereof.

The display apparatus 1 may provide an image using a plurality of main subpixels Pm arranged in the main display area MDA and a plurality of auxiliary subpixels Pa arranged in the component area CA.

When the display apparatus 1 is used as a component of an electronic apparatus, the electronic apparatus may further include a component 40 (see, e.g., FIG. 2) arranged on the rear surface of the display apparatus 1. As described below with reference to FIG. 2, in the component area CA of the display apparatus 1, a component 40 as an electronic element may be arranged under a substrate 100 to correspond to the component area CA. The component 40 may include an imaging device as a camera using infrared light or visible light. Alternatively (or additionally), the component 40 may include at least one of a solar cell, a flash, an illuminance sensor, a proximity sensor, and an iris sensor. Alternatively (or additionally), the component 40 may have a function of receiving sound. To minimize (or at least reduce) the limitation of the function of the component 40, the component area CA may include a transmission area TA that may transmit light and/or sound output from the component 40 to the outside or propagating toward the component 40 from the outside. In the case of the display apparatus 1 when light is transmitted through the component area CA, the light transmittance thereof may be about 10% or more, for example, about 40% or more, about 25% or more, about 50% or more, about 85% or more, e.g., about 90% or more.

A plurality of auxiliary subpixels Pa may be arranged in the component area CA. The plurality of auxiliary subpixels Pa may provide a certain image by emitting light. The image displayed in the component area CA may be an auxiliary image and may have a lower resolution than the image displayed in the main display area MDA. For instance, the component area CA may include a transmission area TA through which light and sound may be transmitted, and when no subpixel is arranged over the transmission area TA, the number of auxiliary subpixels Pa that may be arranged per unit area therein may be less than the number of main subpixels Pm arranged per unit area in the main display area MDA.

Figure 2:
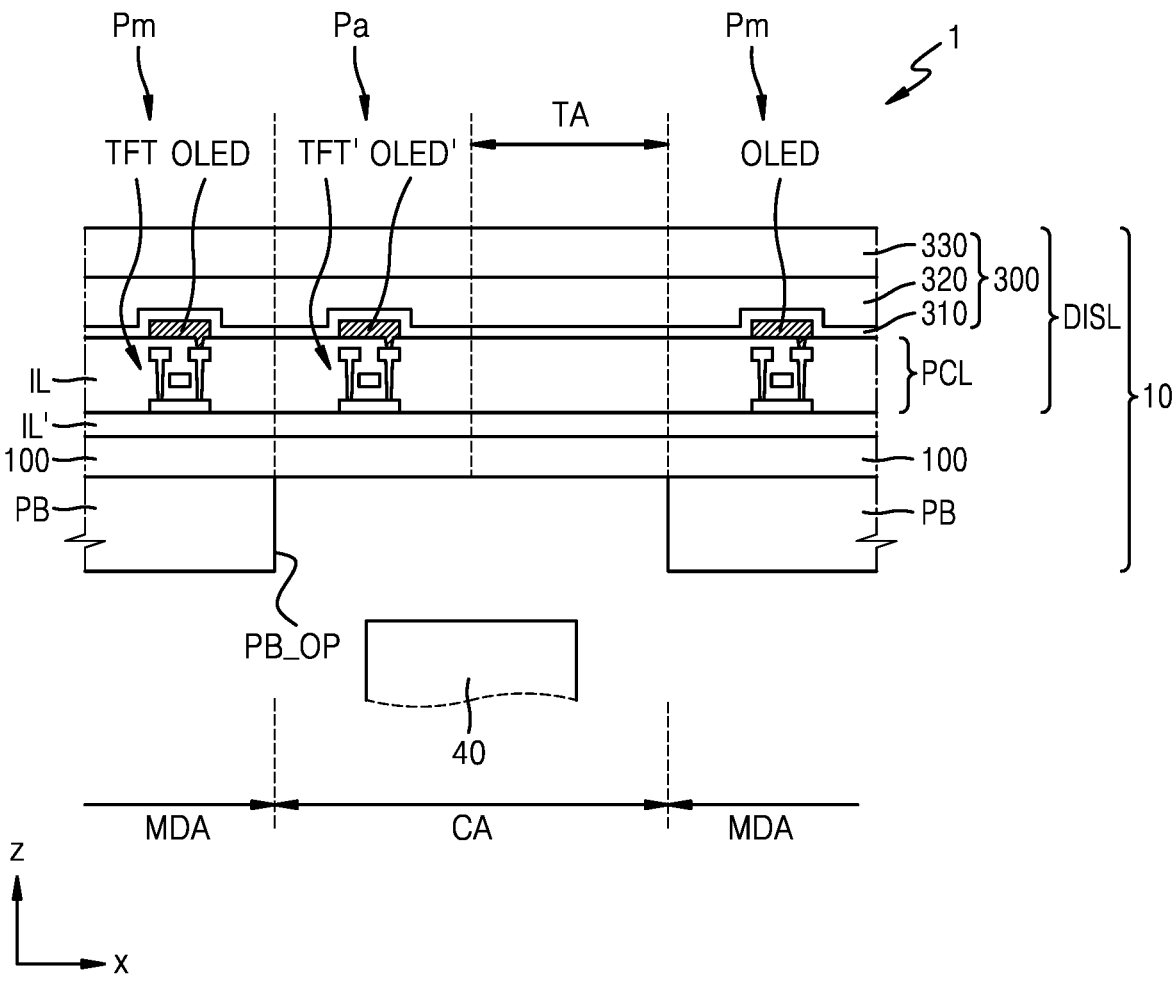
FIG. 2 is a cross-sectional view schematically illustrating a display apparatus according to an embodiment.

FIG. 2 is a cross-sectional view schematically illustrating a display apparatus according to an embodiment.

Referring to FIG. 2, a display apparatus 1 may include a display panel 10 and a component 40 overlapping the display panel 10. A cover window for protecting the display panel 10 may be further arranged over the display panel 10.

The display panel 10 may include a component area CA overlapping the component 40 and a main display area MDA where a main image is displayed. The display panel 10 may include a substrate 100, a display layer DISL over the substrate 100, and a protection member PB arranged under the substrate 100.

The display layer DISL may include a circuit layer PCL including thin film transistors TFT and TFT', display elements including main and auxiliary organic light emitting diodes OLED and OLED', and a thin film encapsulation layer 300. Insulating layers IL and IL' may be arranged between the substrate 100 and the display layer DISL.

The substrate 100 may include an insulating material, such as at least one of glass, quartz, and polymer resin. The substrate 100 may include at least one of a rigid substrate and a flexible substrate capable of bending, folding, rolling, and/or the like.

A main thin film transistor TFT and a main light emitting diode OLED connected thereto may be arranged in the main display area MDA of the display panel 10 to implement a main subpixel Pm, and an auxiliary thin film transistor TFT' and an auxiliary light emitting diode OLED' connected thereto may be arranged in the component area CA to implement an auxiliary subpixel Pa. An area of the component area CA in which the auxiliary subpixel Pa is arranged may be referred to as an auxiliary display area.

The component area CA may include a transmission area TA in which no display element is arranged. The transmission area TA may be an area through which the light/signal output from the component 40 or the light/signal input to the component 40 arranged to correspond to the component area CA is transmitted. The auxiliary display area and the transmission area TA may be alternately arranged in the component area CA with respect to one or more directions, e.g., with respect to the y-axis direction and the x-axis direction.

The main and auxiliary organic light emitting diodes OLED and OLED' may be covered by the thin film encapsulation layer 300. The thin film encapsulation layer 300 may include at least one inorganic encapsulation layer and at least one organic encapsulation layer. For example, the thin film encapsulation layer 300 may include a first inorganic encapsulation layer 310, a second inorganic encapsulation layer 330, and an organic encapsulation layer 320 therebetween. In an embodiment, the main and auxiliary organic light emitting diodes OLED and OLED' may be encapsulated by an encapsulation substrate. When the main and auxiliary organic light emitting diodes OLED and OLED' are encapsulated by an encapsulation substrate, the encapsulation substrate may be arranged to face the substrate 100 with the main and auxiliary organic light emitting diodes OLED and OLED' therebetween. A gap may be between the encapsulation substrate and the main and auxiliary organic light emitting diodes OLED and OLED'. The encapsulation substrate may include glass. A sealant including frit or the like may be arranged between the substrate 100 and the encapsulation substrate, and the sealant may be arranged in the peripheral area DPA described above. The sealant arranged in the peripheral area DPA may surround the display area DA to prevent moisture, debris, etc. from penetrating through the side surface thereof.

The protection member PB may be attached under the substrate 100 to support and protect the substrate 100. The protection member PB may include an opening PB_OP corresponding to the component area CA. Because the protection member PB includes the opening PB_OP, the light transmittance of the component area CA may be improved. The protection member PB may include, for instance, at least one of polyethylene terephthalate (PET) and polyimide (PI), but embodiments are not limited thereto.

The area of the component area CA may be greater than the area where the component 40 is arranged. Accordingly, the area of the opening PB_OP in the protection member PB may not match the area of the component area CA.

In some embodiments, a plurality of components 40 may be arranged in the component area CA. The plurality of components 40 may have different functions. For example, the plurality of components 40 may include at least two of a camera (or imaging device), a solar cell, a flash, a proximity sensor, an illuminance sensor, and an iris sensor.

Figure 3:
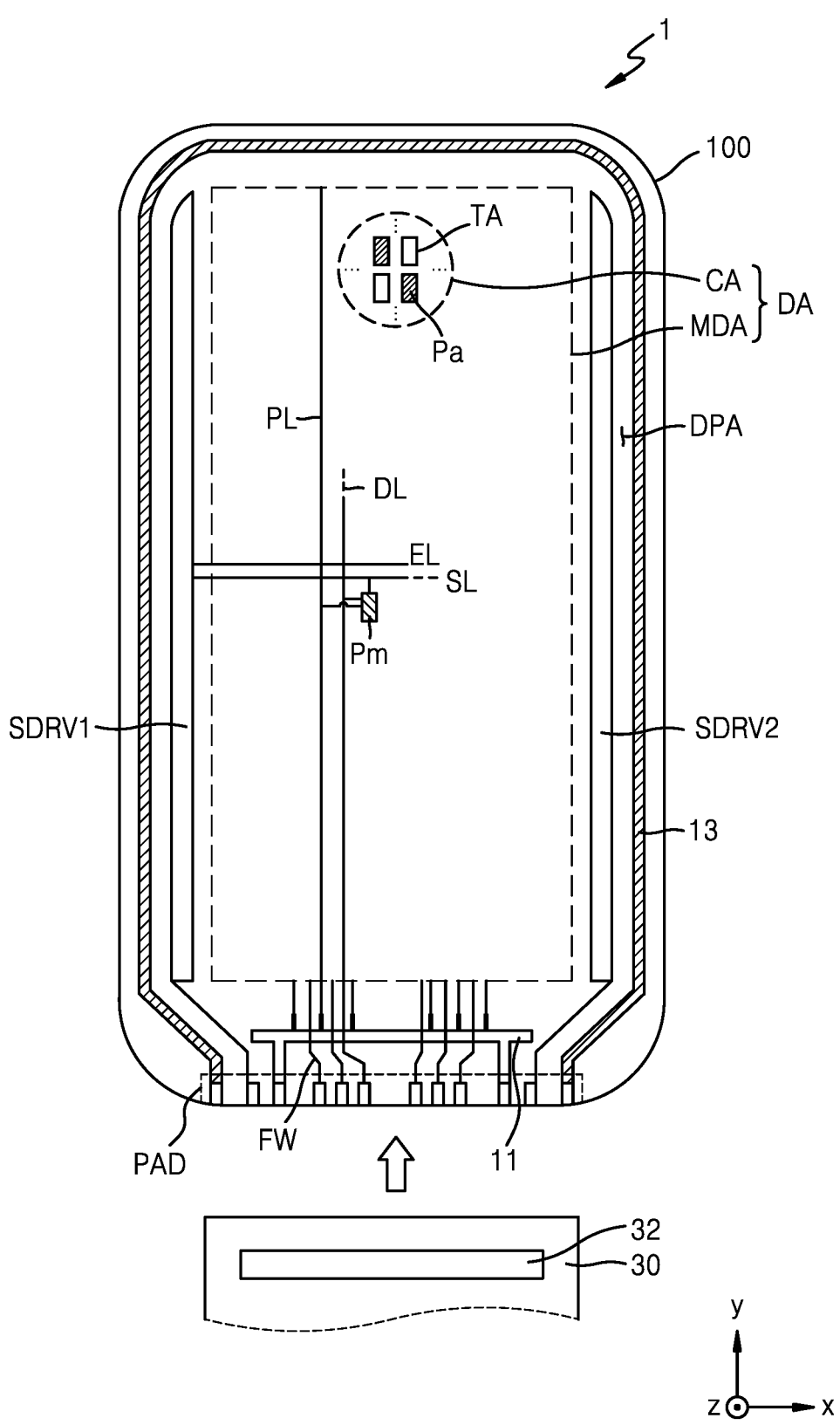
FIG. 3 is a plan view schematically illustrating a display apparatus according to an embodiment.

FIG. 3 is a plan view schematically illustrating a display apparatus according to an embodiment.

Referring to FIG. 3, various components constituting a display apparatus 1 may be arranged over (or on) a substrate 100. The substrate 100 may include a display area DA and a peripheral area DPA surrounding the display area DA. The display area DA may include a main display area MDA in which a main image is displayed, and a component area CA, which includes a transmission area TA and in which an auxiliary image is displayed. The auxiliary image may form an entire image together with the main image, and the auxiliary image may be an image independent from the main image.

A plurality of main subpixels Pm may be arranged in the main display area MDA. Each of the main subpixels Pm may be implemented by a display element, such as a main organic light emitting diode OLED. Each main subpixel Pm may emit, for example, at least one of red, green, blue, and white light; however, any other suitable color of light may be emitted whether in addition to or alternatively of at least of the red, green, blue, and white light. The main display area MDA may be covered with an encapsulation layer to be protected from external air or moisture.

The component area CA may be at one side of the main display area MDA as described above or may be arranged inside the display area DA and surrounded by the main display area MDA. A plurality of auxiliary subpixels Pa may be arranged in the component area CA. Each of the plurality of auxiliary subpixels Pa may be implemented by a display element, such as an auxiliary organic light emitting diode OLED'. Each auxiliary subpixel Pa may emit, for example, at least one of red, green, blue, and white light; however, any other suitable color of light may be emitted whether in addition to or alternatively of at least of the red, green, blue, and white light. The component area CA may be covered with an encapsulation layer to be protected from external air or moisture.

The component area CA may include a transmission area TA. The transmission area TA may be arranged to surround a plurality of auxiliary subpixels Pa. Alternatively, the transmission area TA may be arranged in a grid form with a plurality of auxiliary subpixels Pa.

Because the component area CA includes a transmission area TA, the resolution of the component area CA may be lower than the resolution of the main display area MDA. For example, the resolution of the component area CA may be about $\frac{1}{2}$, $\frac{3}{8}$, $\frac{1}{3}$, $\frac{1}{4}$, $\frac{2}{9}$, $\frac{1}{8}$, $\frac{1}{9}$, or $\frac{1}{16}$ of the resolution of the main display area MDA. For example, the resolution of the main display area MDA may be about 400 pixels per inch (ppi) or more, and the resolution of the component area CA may be about 200 ppi or about 100 ppi.

Each of the pixel circuits driving the main and auxiliary subpixels Pm and Pa may be electrically connected to peripheral circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the pixel circuits driving the main and auxiliary subpixels Pm and Pa through a scan line SL. The first scan driving circuit SDRV1 may apply an emission control signal to each pixel circuit through an emission control line EL. The second scan driving circuit SDRV2 may be on the opposite side of the first scan driving circuit SDRV1 with respect to the main display area MDA and may be substantially parallel to the first scan driving circuit SDRV1. Some of the pixel circuits of the main subpixels Pm of the main display area MDA may be electrically connected to the first scan driving circuit SDRV1, and the others may be electrically connected to the second scan driving circuit SDRV2. Some of the pixel circuits of the auxiliary subpixels Pa of the component area CA may be electrically connected to the first scan driving circuit SDRV1, and the others may be electrically connected to the second scan driving circuit SDRV2. In an embodiment, the second scan driving circuit SDRV2 may be omitted.

The terminal portion PAD may be arranged at one side of the substrate 100. The terminal portion PAD may be exposed by not being covered by an insulating layer, to be connected to a display circuit board 30. A display driver 32 may be arranged at (or on) the display circuit board 30.

The display driver 32 may generate a control signal to be transmitted to the first scan driving circuit SDRV1 and the second scan driving circuit SDRV2. The display driver 32 may generate a data signal, and the generated data signal may be transmitted to the pixel circuits of the main and auxiliary subpixels Pm and Pa through a fan-out line FW and a data line DL connected to the fan-out line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the main and auxiliary subpixels Pm and Pa through the driving voltage line PL connected to the driving voltage supply line 11, and the common voltage ELVSS may be connected to the common voltage supply line 13 to be applied to an opposite electrode of the display element, e.g., the main organic light emitting diode OLED.

The driving voltage supply line 11 may be provided to extend in the x direction under the main display area MDA. The common voltage supply line 13 may have a shape in which one side is open in a loop shape to partially surround the main display area MDA.

Figure 4:
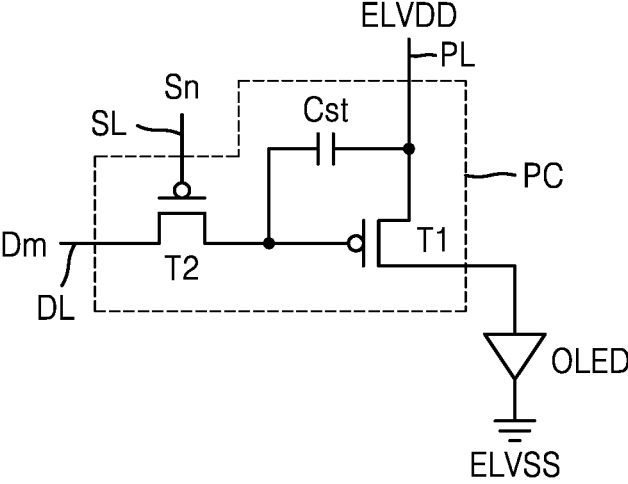
FIGS. 4 and 5 are equivalent circuit diagrams of pixels that may be included in a display apparatus according to various embodiments.
Figure 5:
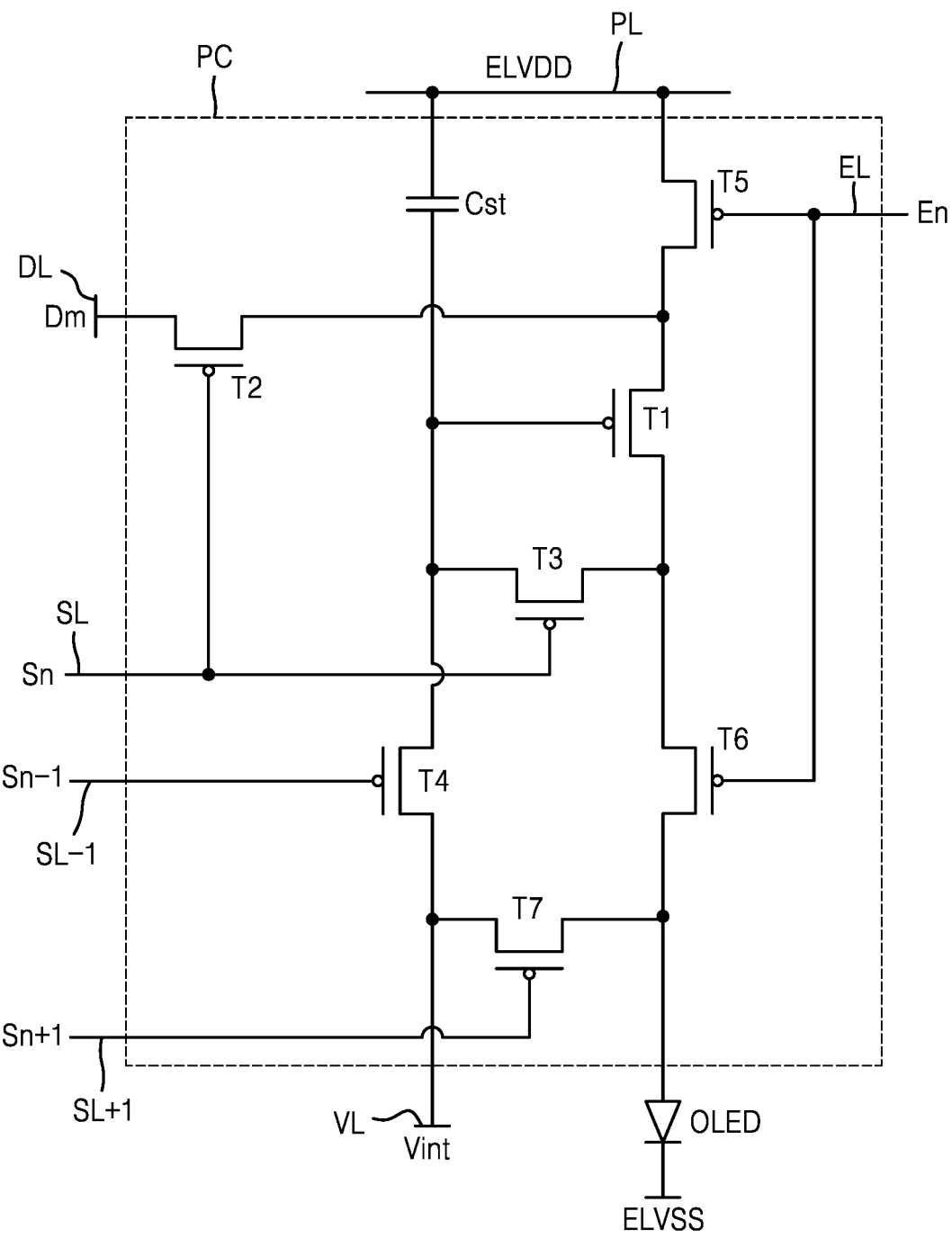

FIGS. 4 and 5 are equivalent circuit diagrams of subpixels that may be included in a display apparatus according to various embodiments.

Referring to FIG. 4, a pixel circuit PC may be connected to an organic light emitting diode OLED to implement light emission of a subpixel. The pixel circuit PC may include a driving thin film transistor T1, a switching thin film transistor T2, and a storage capacitor Cst. The switching thin film transistor T2 may be connected to a scan line SL and a data line DL and may be configured to transmit a data signal Dm input through the data line DL to the driving thin film transistor T1 according to a scan signal Sn input through the scan line SL.

The storage capacitor Cst may be connected to the switching thin film transistor T2 and a driving voltage line PL and may store a voltage corresponding to the difference between a voltage received from the switching thin film transistor T2 and a driving voltage ELVDD supplied to the driving voltage line PL.

The driving thin film transistor T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness according to the driving current.

Although FIG. 4 illustrates that the pixel circuit PC includes two thin film transistors and one storage capacitor, embodiments are not limited thereto.

Referring to FIG. 5, a pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

Although FIG. 5 illustrates that each pixel circuit PC includes signal lines SL, SL−1, SL+1, EL, and DL, an initialization voltage line VL, and a driving voltage line PL, embodiments are not limited thereto. In an embodiment, at least one of the signal lines SL, SL−1, SL+1, EL, and DL and/or the initialization voltage line VL may be shared by adjacent pixel circuits.

The drain electrode of the driving thin film transistor T1 may be electrically connected to an organic light emitting diode OLED via the emission control thin film transistor T6.

The driving thin film transistor T1 may receive a data signal Dm according to a switching operation of the switching thin film transistor T2 and supply a driving current to the organic light emitting diode OLED.

The gate electrode of the switching thin film transistor T2 may be connected to the scan line SL, and the source electrode of the switching thin film transistor T2 may be connected to the data line DL. The drain electrode of the switching thin film transistor T2 may be connected to the driving voltage line PL via the operation control thin film transistor T5 while being connected to the source electrode of the driving thin film transistor T1.

The switching thin film transistor T2 may be turned on according to a scan signal Sn received through the scan line SL to perform a switching operation of transmitting the data signal Dm transmitted to the data line DL to the source electrode of the driving thin film transistor T1.

The gate electrode of the compensation thin film transistor T3 may be connected to the scan line SL. The source electrode of the compensation thin film transistor T3 may be connected to the pixel electrode of the organic light emitting diode OLED via the emission control thin film transistor T6 while being connected to the drain electrode of the driving thin film transistor T1. The drain electrode of the compensation thin film transistor T3 may be connected to an electrode of the storage capacitor Cst, the source electrode of the first initialization thin film transistor T4, and the gate electrode of the driving thin film transistor T1. The compensation thin film transistor T3 may be turned on according to the scan signal Sn received through the scan line SL to connect the gate electrode and the drain electrode of the driving thin film transistor T1 to each other to diode-connect the driving thin film transistor T1.

The gate electrode of the first initialization thin film transistor T4 may be connected to the previous scan line SL−1. The drain electrode of the first initialization thin film transistor T4 may be connected to the initialization voltage line VL. The source electrode of the first initialization thin film transistor T4 may be connected to an electrode of the storage capacitor Cst, the drain electrode of the compensation thin film transistor T3, and the gate electrode of the driving thin film transistor T1. The first initialization thin film transistor T4 may be turned on according to a previous scan signal Sn−1 received through the previous scan line SL−1 to perform an initialization operation of initializing the voltage of the gate electrode of the driving thin film transistor T1 by transmitting an initialization voltage Vint to the gate electrode of the driving thin film transistor T1.

The gate electrode of the operation control thin film transistor T5 may be connected to the emission control line EL. The source electrode of the operation control thin film transistor T5 may be connected to the driving voltage line PL. The drain electrode of the operation control thin film transistor T5 may be connected to the source electrode of the driving thin film transistor T1 and the drain electrode of the switching thin film transistor T2.

The gate electrode of the emission control thin film transistor T6 may be connected to the emission control line EL. The source electrode of the emission control thin film transistor T6 may be connected to the drain electrode of the driving thin film transistor T1 and the source electrode of the compensation thin film transistor T3. The drain electrode of the emission control thin film transistor T6 may be electrically connected to the pixel electrode (e.g., anode) of the organic light emitting diode OLED. The operation control thin film transistor T5 and the emission control thin film transistor T6 may be simultaneously (or substantially simultaneously) turned on according to an emission control signal En received through the emission control line EL such that a driving voltage ELVDD may be transmitted to the organic light emitting diode OLED and a driving current may flow through the organic light emitting diode OLED.

The gate electrode of the second initialization thin film transistor T7 may be connected to the next scan line SL+1. The source electrode of the second initialization thin film transistor T7 may be connected to the pixel electrode of the organic light emitting diode OLED. The drain electrode of the second initialization thin film transistor T7 may be connected to the initialization voltage line VL. The second initialization thin film transistor T7 may initialize the pixel electrode of the organic light emitting diode OLED by being turned on according to a next scan signal Sn+1 received through the next scan line SL+1.

Although FIG. 5 illustrates a case where the first initialization thin film transistor T4 and the second initialization thin film transistor T7 are respectively connected to the previous scan line SL−1 and the next scan signal SL+1, embodiments are not limited thereto. In an embodiment, both the first initialization thin film transistor T4 and the second initialization thin film transistor T7 may be connected to the previous scan line SLn−1 to be driven according to the previous scan signal Sn−1.

The other electrode of the storage capacitor Cst may be connected to the driving voltage line PL. Any one electrode of the storage capacitor Cst may be connected to the gate electrode of the driving thin film transistor T1, the drain electrode of the compensation thin film transistor T3, and the source electrode of the first initialization thin film transistor T4.

The opposite electrode (e.g., cathode) of the organic light emitting diode OLED may be provided with a common voltage ELVSS. The organic light emitting diode OLED may emit light by receiving a driving current from the driving thin film transistor T1.

The pixel circuit PC is not limited to the number and circuit design of the thin film transistors and storage capacitor described with reference to FIG. 5, and the number and circuit design thereof may be variously modified. The pixel circuits PC driving the main subpixel Pm and the auxiliary subpixel Pa may be provided in the same manner or may be provided in different manners.

Figure 6:
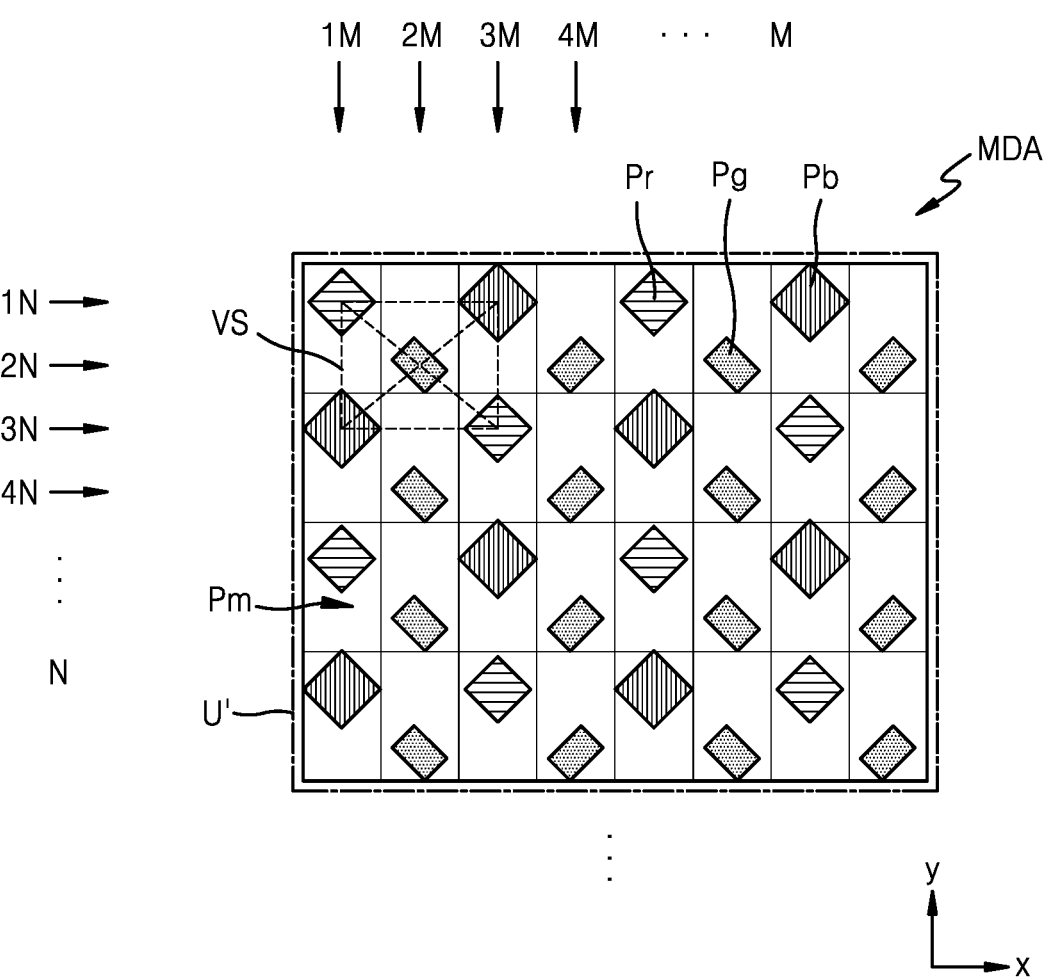
FIG. 6 is an arrangement diagram schematically illustrating a pixel arrangement structure in a main display area according to an embodiment.

FIG. 6 is an arrangement diagram schematically illustrating a pixel arrangement structure in a main display area according to an embodiment.

A plurality of main subpixels Pm may be arranged in the main display area MDA. For the purposes of this disclosure, a subpixel may refer to an emission area as a minimum unit for implementing an image. Moreover, when an organic light emitting diode is used as a display element, the emission area may be defined by an opening of a pixel definition layer. This will be described below.

As in FIG. 6, the main subpixels Pm arranged in the main display area MDA may be arranged in a pentile structure. A red subpixel Pr, a green subpixel Pg, and a blue subpixel Pb may respectively implement red, green, and blue colors.

A plurality of red subpixels Pr and a plurality of blue subpixels Pb may be alternately arranged in a first row 1N, a plurality of green subpixels Pg may be arranged at certain intervals in a second row 2N adjacent to the first row 1N, a plurality of blue subpixels Pb and a plurality of red subpixels Pr may be alternately arranged in a third row 3N adjacent to the second row 2N, a plurality of green subpixels Pg may be arranged at certain intervals in a fourth row 4N adjacent to the third row 3N, and this pixel arrangement may be repeated up to an Nth row. In this case, the blue subpixel Pb and the red subpixel Pr may be larger than the green subpixel Pg.

The plurality of red subpixels Pr and the plurality of blue subpixels Pb arranged in the first row 1N, and the plurality of green subpixels Pg arranged in the second row 2N may be alternately arranged.

A plurality of red subpixels Pr and a plurality of blue subpixels Pb may be alternately arranged in a first column 1M, a plurality of green subpixels Pg may be arranged at certain intervals in a second column 2M adjacent to the first column 1M, a plurality of blue subpixels Pb and a plurality of red subpixels Pr may be alternately arranged in a third column 3M adjacent to the second column 2M, a plurality of green subpixels Pg may be arranged at certain intervals in a fourth column 4M adjacent to the third column 3M, and this pixel arrangement may be repeated up to an Mth column.

When this pixel arrangement structure is expressed differently, it may be stated that the red subpixels Pr are arranged at the first and third vertexes facing each other among the vertexes of a virtual square VS having a central point of the green subpixel Pg as a central point thereof and the blue subpixels Pb are arranged at the second and fourth vertexes that are the other vertexes thereof. In this case, the virtual square VS may be variously modified into a rectangle, a rhombus, a square, or the like.

Such a pixel arrangement structure may be referred to as a pentile matrix structure or a pentile structure, and high resolution may be implemented by a small number of pixels by applying a rendering drive technique(s) that represents colors by sharing adjacent pixels.

Although FIG. 6 illustrates that a plurality of main subpixels Pm are arranged in a pentile matrix structure, embodiments are not limited thereto. For example, a plurality of main subpixels Pm may be arranged in various forms, such as at least one of a stripe structure, a mosaic arrangement structure, and a delta arrangement structure.

Figure 7:
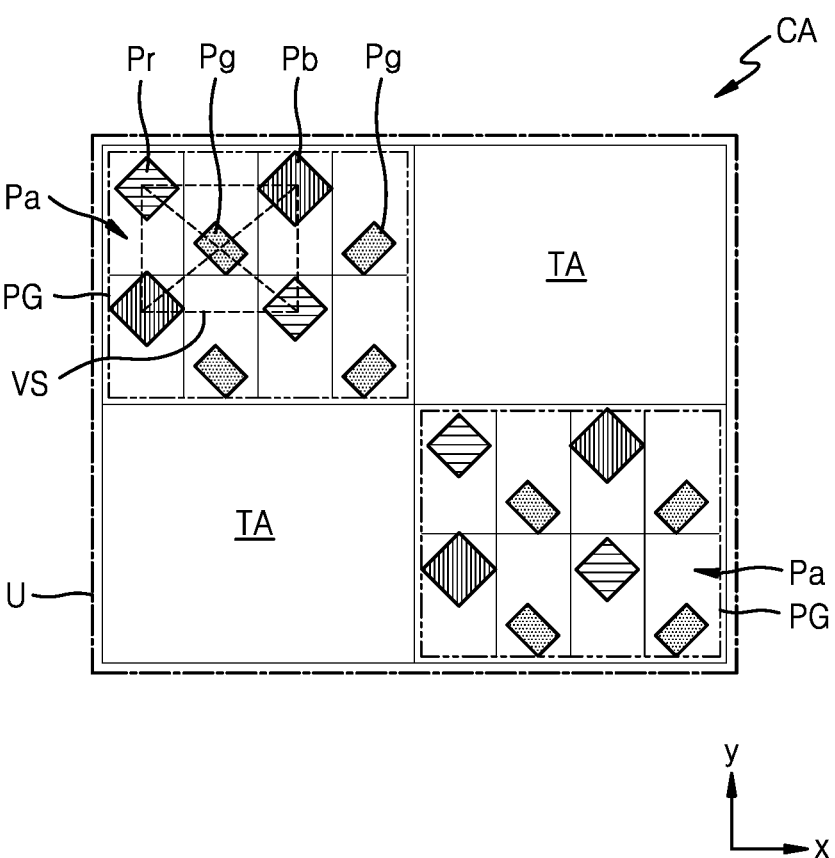
FIGS. 7 and 8 are arrangement diagrams schematically illustrating a pixel arrangement structure in a component area according to various embodiments.
Figure 8:
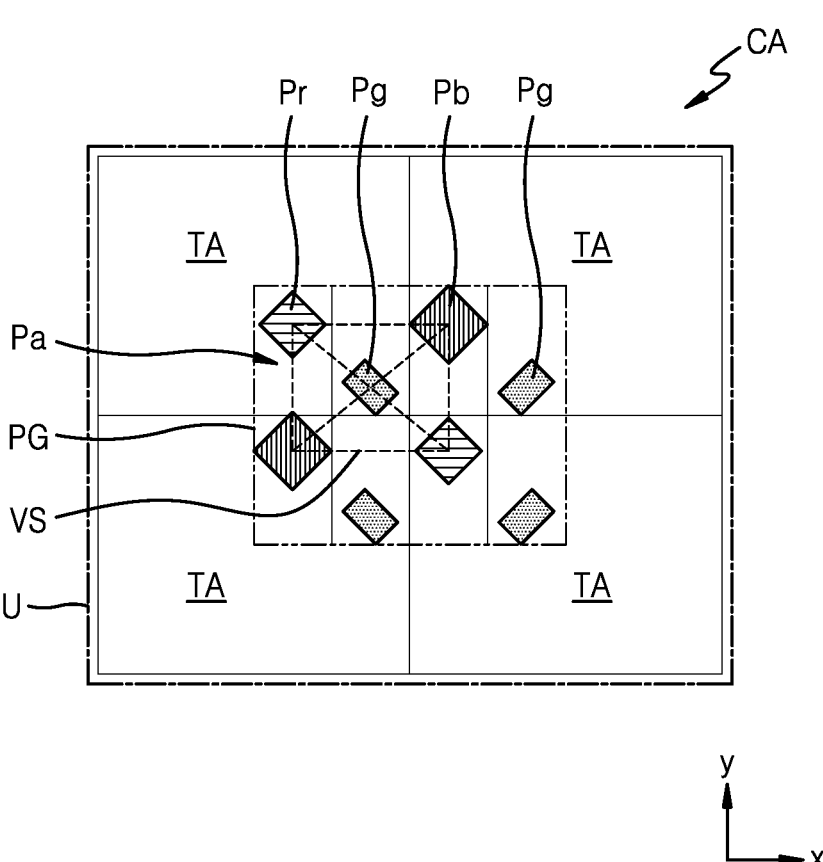

FIGS. 7 and 8 are arrangement diagrams schematically illustrating a pixel arrangement structure in a component area according to embodiments.

Referring to FIG. 7, a plurality of auxiliary subpixels Pa may be arranged in the component area CA. Each of the auxiliary subpixels Pa may, for instance, emit any one of red, green, and blue light.

The component area CA may include a pixel group PG including at least one or more auxiliary subpixels Pa and a transmission area TA. The pixel group PG and the transmission area TA may be alternately arranged in the x direction and in the y direction and may be arranged, for example, in a grid form. In this case, the component area CA may include a plurality of pixel groups PG and a plurality of transmission areas TA.

The pixel group PG may be defined as a subpixel group in which a plurality of auxiliary subpixels Pa are bound (or arranged) in a preset unit. For example, as illustrated in FIG. 7, one pixel group PG may include eight auxiliary subpixels Pa arranged in a pentile structure. For instance, one pixel group PG may include two red subpixels Pr, four green subpixels Pg, and two blue subpixels Pb.

In the component area CA, a basic unit U in which a certain number of pixel groups PG and a certain number of transmission areas TA are bound may be repeatedly arranged in the x direction and the y direction. In FIG. 7, the basic unit U may have a form in which two pixel groups PG and two transmission areas TA arranged therearound are bound in a square shape. The basic unit U may be a division of the repeated form and may not mean a disconnection of the configuration.

Referring to FIGS. 6 and 7, a corresponding unit U' having the same area as the basic unit U may be set in the main display area MDA. In this case, the number of main subpixels Pm included in the corresponding unit U' may be greater than the number of auxiliary subpixels Pa included in the basic unit U. For instance, the number of auxiliary subpixels Pa included in the basic unit U may be 16 and the number of main subpixels Pm included in the corresponding unit U' may be 32 such that the number of auxiliary subpixels Pa and the number of main subpixels Pm arranged per the same area may be in a ratio of 1:2.

A pixel arrangement structure of the component area CA in which the arrangement structure of auxiliary subpixels Pa is a pentile structure as in FIG. 7 and the resolution thereof is ½ of the resolution of the main display area MDA will be referred to as a ½ pentile structure. The number or arrangement of auxiliary subpixels Pa included in the pixel group PG may be modified according to the resolution of the component area CA.

Referring to FIG. 8, a pixel arrangement structure of the component area CA may be a ¼ pentile structure. In this case, eight auxiliary subpixels Pa may be arranged in a pentile structure in a pixel group PG, but only one pixel group PG may be included in a basic unit U. The remaining area of the basic unit U may be provided as a transmission area TA. Thus, the number of auxiliary subpixels Pa and the number of main subpixels Pm arranged per the same area may be in the ratio of 1:4. In this case, one pixel group PG may be surrounded by the transmission area TA.

Figure 9:
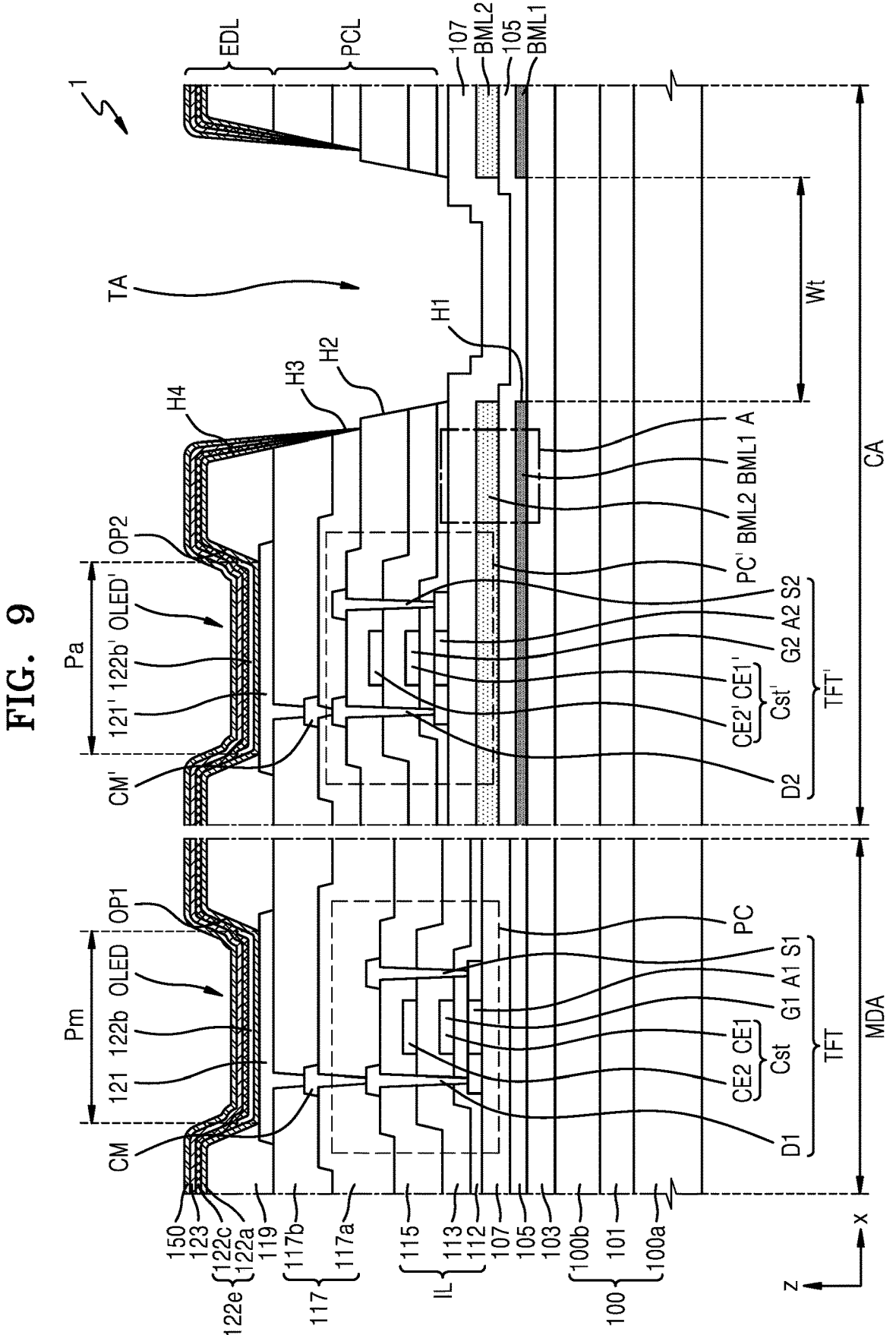
FIG. 9 is a cross-sectional view schematically illustrating a display apparatus according to an embodiment.
Figure 10:
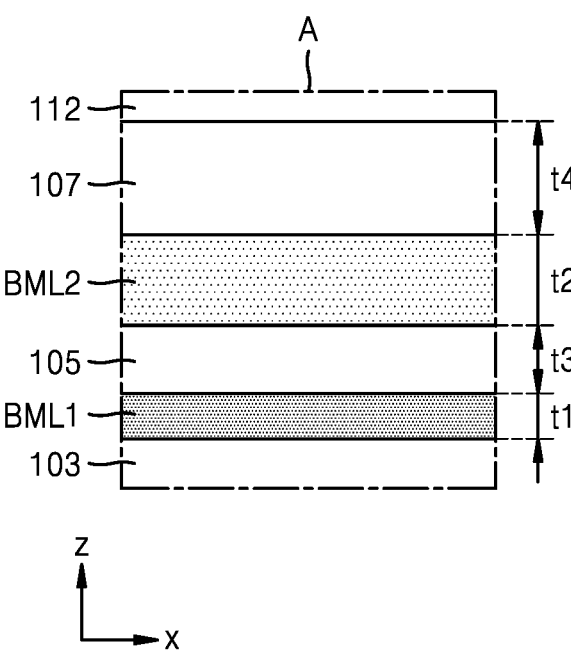
FIG. 10 is a cross-sectional view schematically illustrating a display apparatus according to an embodiment.

FIG. 9 is a cross-sectional view schematically illustrating a display apparatus according to an embodiment. FIG. 10 is a cross-sectional view schematically illustrating a display apparatus according to an embodiment.

More particularly, FIG. 9 is a schematic cross-sectional view illustrating a portion of a display apparatus 1 according to an embodiment and is a cross-sectional view schematically illustrating a main display area MDA and a component area CA, and FIG. 10 is an enlarged cross-sectional view of region A of FIG. 9.

Referring to FIG. 9, the display apparatus 1 according to an embodiment may include a main display area MDA and a component area CA. A main subpixel Pm may be arranged in the main display area MDA, and an auxiliary subpixel Pa may be arranged in the component area CA. The component area CA may include a transmission area TA.

A main pixel circuit PC including a main thin film transistor TFT and a main storage capacitor Cst, and a main organic light emitting diode OLED as a display element connected to the main pixel circuit PC may be arranged in the main display area MDA. An auxiliary pixel circuit PC' including an auxiliary thin film transistor TFT' and an auxiliary storage capacitor Cst', and an auxiliary organic light emitting diode OLED' as a display element connected to the auxiliary pixel circuit PC' may be arranged in the component area CA.

In an embodiment, main and auxiliary organic light emitting diodes OLED and OLED' are used as display elements; however, in some embodiments, an inorganic light emitting element, a quantum dot light emitting element, or the like may be used as a display element.

Hereinafter, a structure in which the components included in the display apparatus 1 are stacked will be described. The display apparatus 1 may include a stack of a substrate 100, barrier layers 105 and 107, a circuit layer PCL, and a display element layer EDL. For example, the barrier layers 105 and 107, the circuit layer PCL, and the display element layer EDL may be arranged over the upper surface of the substrate 100.

As described above, the substrate 100 may include an insulating material, such as glass, quartz, or polymer resin. The substrate 100 may include at least one of a rigid substrate and a flexible substrate capable of bending, folding, rolling, and/or the like.

The substrate 100 may include a first substrate 100a and a second substrate 100b. The first substrate 100a and the second substrate 100b may include a polymer resin, such as at least one of polyethersulfone, polyacrylate, polyetherimide, polyethylene naphthalate, polyethylene terephthalate, polyphenylene sulfide, polyarylate, polyimide, polycarbonate, and cellulose acetate propionate. For example, the first substrate 100a and the second substrate 100b may include transparent polyimide.

A third barrier layer 101 may be arranged between the first substrate 100a and the second substrate 100b. In an embodiment, the third barrier layer 101 may be directly arranged on the first substrate 100a. In an embodiment, an inorganic layer, an organic layer, or the like may be additionally arranged between the first substrate 100a and the third barrier layer 101. The third barrier layer 101 may be arranged over the first substrate 100a to prevent gas emitted from the first substrate 100a from reaching a semiconductor layer described below and to block penetration of external air. The third barrier layer 101 may include at least one of silicon oxide ($SiO_x$) and silicon nitride ($SiN_x$). For example, the third barrier layer 101 may include a single layer or a multiple layer structure.

A fourth barrier layer 103 may be arranged over the second substrate 100b. In an embodiment, the fourth barrier layer 103 may be directly arranged on the second substrate 100b. In an embodiment, an inorganic layer, an organic layer, or the like may be additionally arranged between the second substrate 100b and the fourth barrier layer 103. The fourth barrier layer 103 may be arranged over the first substrate 100a and the second substrate 100b to prevent gas emitted from the first substrate 100a and the second substrate 100b from reaching a semiconductor layer described below and to block penetration of external air.

A first bottom metal layer BML1 may be arranged over the fourth barrier layer 103. In an embodiment, the first bottom metal layer BML1 may be directly arranged on the fourth barrier layer 103. In an embodiment, an inorganic layer, an organic layer, or the like may be additionally arranged between the fourth barrier layer 103 and the first bottom metal layer BML1.

The first bottom metal layer BML1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). For example, the first bottom metal layer BML1 may include molybdenum (Mo) or titanium (Ti). In an embodiment, the first bottom metal layer BML1 may be semitransparent. Because the first bottom metal layer BML1 is semitransparent, light incident on the first bottom metal layer BML1 may be partially reflected and partially transmitted.

A second bottom metal layer BML2 may be arranged over the first bottom metal layer BML1. The first bottom metal layer BML1 and the second bottom metal layer BML2 may at least partially overlap each other. In an embodiment, the second bottom metal layer BML2 may include the same material as the first bottom metal layer BML1. In an embodiment, the second bottom metal layer BML2 may include a different material than the first bottom metal layer BML1.

The first bottom metal layer BML1 and the second bottom metal layer BML2 may be arranged under the auxiliary pixel circuit PC' to prevent the degradation of the characteristics of the auxiliary thin film transistor TFT' by the light emitted from a component or the like. Also, the first bottom metal layer BML1 and the second bottom metal layer BML2 may prevent the light emitted from the component or the like or directed to the component from diffracting through a narrow gap between the lines connected to the auxiliary pixel circuit PC'. The first bottom metal layer BML1 and the second bottom metal layer BML2 may not be in the transmission area TA.

The first bottom metal layer BML1 and the second bottom metal layer BML2 may overlap the auxiliary pixel circuit PC' arranged in the component area CA. For example, the first bottom metal layer BML1 and the second bottom metal layer BML2 may be provided to correspond to the entire component area CA. In this case, the first bottom metal layer BML1 may include a first hole H1 corresponding to the transmission area TA. For example, the first hole H1 may be provided in the second bottom metal layer BML2. In some embodiments, the shape and size of the transmission area TA may be defined by the shape and size of the first hole H1 defined by the first bottom metal layer BML1. The smallest width Wt of the transmission area TA may be equal to the width of the first hole H1 defined by the first bottom metal layer BML1.

It may be advantageous in terms of a process that the first bottom metal layer BML1 and the second bottom metal layer BML2 are not arranged in the main display area MDA. When the first bottom metal layer BML1 and the second bottom metal layer BML2 are provided at a front surface of the substrate 100 or at a corresponding portion thereof, a defect may occur in the process of crystallizing a main semiconductor layer A1 of the main thin film transistor TFT by using a laser.

A first barrier layer 105 may be arranged over the first bottom metal layer BML1. In an embodiment, the first barrier layer 105 may be directly arranged on the first bottom metal layer BML1. In an embodiment, an inorganic layer, an organic layer, or the like may be additionally arranged between the first bottom metal layer BML1 and the first barrier layer 105.

At least a portion of the first barrier layer 105 may be arranged over the transmission area TA. The first barrier layer 105 may be arranged between the first bottom metal layer BML1 and the second bottom metal layer BML2 such that the first bottom metal layer BML1 and the second bottom metal layer BML2 may be spaced apart by a certain distance. The first barrier layer 105 may at least one of include silicon oxide ($SiO_x$) and silicon nitride ($SiN_x$).

A second barrier layer 107 may be arranged over the second bottom metal layer BML2. In an embodiment, the second barrier layer 107 may be directly arranged on the second bottom metal layer BML2. In an embodiment, an inorganic layer, an organic layer, or the like may be additionally arranged between the second bottom metal layer BML12 and the second barrier layer 107.

At least a portion of the second barrier layer 107 may be arranged over the transmission area TA. In an embodiment, the second barrier layer 107 may include the same material as the first barrier layer 105. In an embodiment, the second barrier layer 107 may include a different material than the first barrier layer 105.

Referring to FIG. 10, the first bottom metal layer BML1 may have a first thickness t1 from the upper surface of the fourth barrier layer 103. In an embodiment, the first thickness t1 may be, for example, about 20 angstroms (Å) to about 120 Å, e.g., about 30 Å to about 120 Å, such as about 30 Å to about 200 Å. For example, the first thickness t1 of the first bottom metal layer BML1 may be about 30 Å to about 100 Å.

The second bottom metal layer BML2 may have a second thickness t2 from the upper surface of the first barrier layer 105. In an embodiment, the second thickness t2 may be, for example, about 1,000 Å to about 5000 Å, e.g., about 1,000 Å to about 4,500 Å, such as about 1,000 Å to about 4,000 Å. For example, the second thickness t2 of the second bottom metal layer BML2 may be about 1,000 Å to about 3,500 Å. Because the thickness of the second bottom metal layer BML2 is greater than the thickness of the first bottom metal layer BML1, the light transmitted through the first bottom metal layer BML1 may be reflected or absorbed by the second bottom metal layer BML2.

The first barrier layer 105 may have a third thickness t3 from the upper surface of the first bottom metal layer BML1. In an embodiment, the third thickness t3 may be, for example, about 500 Å to about 3,000 Å, e.g., about 500 Å to about 2500 Å, such as about 500 Å to about 2,000 Å. For example, the third thickness t3 of the first barrier layer 105 may be about 500 Å to about 1,500 Å. The first barrier layer 105 may be arranged between the first bottom metal layer BML1 and the second bottom metal layer BML2 such that the first bottom metal layer BML1 and the second bottom metal layer BML2 may be spaced apart from each other.

The second barrier layer 107 may have a fourth thickness t4 from the upper surface of the second bottom metal layer BML2. In an embodiment, the fourth thickness t4 may be, for example, about 800 Å to about 4,000 Å, e.g., about 1,000 Å to about 3,500 Å, such as about 1,000 Å to about 3,000 Å. For example, the fourth thickness t4 of the second barrier layer 107 may be about 1,000 Å to about 2,000 Å.

When a bottom metal layer is arranged to correspond to the component area CA, the light transmitted through the transmission area TA is reflected from the surface of the component arranged under the substrate, the light reflected from the surface of the component is reflected under the bottom metal layer, and the reflected light is incident on the component, and thus, a ghost image may be generated. In this case, the ghost image may refer to a phenomenon in which an aperture shape or a light source shape without a subject remains as an afterimage on a film (sensor) at a position symmetrical to a light source, and thus, a blur is seen.

Embodiments of the disclosure may solve various problems, such as the above-noted problems, and may prevent generation of a ghost image by using destructive interference of light. For instance, at least because the bottom metal layer includes the first bottom metal layer BML1 and the second bottom metal layer BML2 and a barrier layer (e.g., the first barrier layer 105) is arranged between the first bottom metal layer BML1 and the second bottom metal layer BML2, the light reflected under the first bottom metal layer BML1 and the light reflected under the second bottom metal layer BML2 may destructively interfere with each other to prevent generation of a ghost image. At least because the first bottom metal layer BML1 is semitransparent, the light incident on the first bottom metal layer BML1 may be partially reflected under the first bottom metal layer BML1 and the unreflected light may be transmitted through the first bottom metal layer BML1. At least because the second bottom metal layer BML2 is thicker than the first bottom metal layer BML1, the light transmitted through the first bottom metal layer BML1 and then incident on the second bottom metal layer BML2 may be reflected under the second bottom metal layer BML2 or the unreflected light may be absorbed by the second bottom metal layer BML2. Thus, the light reflected under the first bottom metal layer BML1 and the light reflected under the second bottom metal layer BML2 may destructively interfere with each other to prevent the generation of a ghost image.

Referring back to FIG. 9, the circuit layer PCL may be arranged over the second barrier layer 107. The circuit layer PCL may include a main pixel circuit PC, an auxiliary pixel circuit PC', a first insulating layer 112, a second insulating layer 113, a third insulating layer 115, and a planarization layer 117. The main pixel circuit PC may include a main thin film transistor TFT and a main storage capacitor Cst, and the auxiliary pixel circuit PC' may include an auxiliary thin film transistor TFT' and an auxiliary storage capacitor Cst'.

The main thin film transistor TFT and the auxiliary thin film transistor TFT' may be arranged over the second barrier layer 107. The main thin film transistor TFT may include a main semiconductor layer A1, a main gate electrode G1, a main source electrode S1, and a main drain electrode D1. The auxiliary thin film transistor TFT' may include an auxiliary semiconductor layer A2, an auxiliary gate electrode G2, an auxiliary source electrode S2, and an auxiliary drain electrode D2. The main thin film transistor TFT may be connected to the main organic light emitting diode OLED to drive the main organic light emitting diode OLED. The auxiliary thin film transistor TFT' may be connected to the auxiliary organic light emitting diode OLED' to drive the auxiliary organic light emitting diode OLED'.

The main semiconductor layer A1 and the auxiliary semiconductor layer A2 may be arranged over the second barrier layer 107 and may include polysilicon, but embodiments are not limited thereto. For instance, the main semiconductor layer A1 and the auxiliary semiconductor layer A2 may include amorphous silicon. As another example, the main semiconductor layer A1 and the auxiliary semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). In an embodiment, the main semiconductor layer A1 and the auxiliary semiconductor layer A2 may include the same material as each other. In an embodiment, the main semiconductor layer A1 and the auxiliary semiconductor layer A2 may include different materials from each other. The main semiconductor layer A1 and the auxiliary semiconductor layer A2 may each include a source area and a drain area that are doped with dopants and a channel area.

The auxiliary semiconductor layer A2 may overlap the second bottom metal layer BML2 with the second barrier layer 107 therebetween. In an embodiment, the width of the auxiliary semiconductor layer A2 may be less than the width of the second bottom metal layer BML2, and thus, the auxiliary semiconductor layer A2 may entirely overlap the second bottom metal layer BML2 in a direction (e.g., z-axis direction) perpendicular to the substrate 100.

The first insulating layer 112 may be provided to cover the main semiconductor layer A1 and the auxiliary semiconductor layer A2. The first insulating layer 112 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). The first insulating layer 112 may include a single layer or a multiple layer including an inorganic insulating material.

The main gate electrode G1 and the auxiliary gate electrode G2 may be arranged over the first insulating layer 112 to respectively overlap the main semiconductor layer A1 and the auxiliary semiconductor layer A2. The main gate electrode G1 and the auxiliary gate electrode G2 may include, for example, at least one of molybdenum (Mo), aluminum (Al), copper (Cu), titanium (Ti), and the like, and may include a single layer or a multiple layer.

The second insulating layer 113 may be provided to cover the main gate electrode G1 and the auxiliary gate electrode G2. The second insulating layer 113 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). The second insulating layer 113 may include a single layer or a multiple layer including an inorganic insulating material.

A main upper electrode CE2 of the main storage capacitor Cst and an auxiliary upper electrode CE2' of the auxiliary storage capacitor Cst' may be arranged over the second insulating layer 113.

In the main display area MDA, the main upper electrode CE2 may overlap the main gate electrode G1 arranged thereunder. The main gate electrode G1 and the main upper electrode CE2 overlapping each other with the second insulating layer 113 therebetween may constitute the main storage capacitor Cst. The main gate electrode G1 may be integrally provided with a main lower electrode CE1 of the main storage capacitor Cst. In an embodiment, the main storage capacitor Cst may not overlap the main thin film transistor TFT, and the main lower electrode CE1 of the main storage capacitor Cst may be a separate independent component from the main gate electrode G1 of the main thin film transistor TFT.

In the component area CA, the auxiliary upper electrode CE2' may overlap the auxiliary gate electrode G2 arranged thereunder. The auxiliary gate electrode G2 and the auxiliary upper electrode CE2' overlapping each other with the second insulating layer 113 therebetween may constitute the auxiliary storage capacitor Cst'. The auxiliary gate electrode G2 may be integrally provided with an auxiliary lower electrode CE1' of the auxiliary storage capacitor Cst'. In an embodiment, the auxiliary storage capacitor Cst' may not overlap the auxiliary thin film transistor TFT', and the auxiliary lower electrode CE1' of the auxiliary storage capacitor Cst' may be a separate independent component from the auxiliary gate electrode G2 of the auxiliary thin film transistor TFT'.

The main upper electrode CE2 and the auxiliary upper electrode CE2' may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may include a single layer or a multiple layer structure.

The third insulating layer 115 may be formed to cover the main upper electrode CE2 and the auxiliary upper electrode CE2'. The third insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). The third insulating layer 115 may include a single layer or a multiple layer including an inorganic insulating material.

When the first insulating layer 112, the second insulating layer 113, and the third insulating layer 115 are collectively referred to as an inorganic insulating layer IL, the inorganic insulating layer IL may have a second hole H2 corresponding to the transmission area TA. The second hole H2 may expose a portion of the upper surface of the second barrier layer 107 arranged over the transmission area TA. The second hole H2 may overlap an opening of the first insulating layer 112, an opening of the second insulating layer 113, and an opening of the third insulating layer 115 formed to correspond to the transmission area TA. The openings may be separately formed through separate processes or may be simultaneously formed through the same process. When the openings are formed in separate processes, the inner surface of the second hole H2 may not be smooth and may have a stair-shaped step.

The main and auxiliary source electrodes S1 and S2 and the main and auxiliary drain electrodes D1 and D2 may be arranged over the third insulating layer 115. The main and auxiliary source electrodes S1 and S2 and the main and auxiliary drain electrodes D1 and D2 may include a conductive material including at least one of molybdenum (Mo), aluminum (Al), copper (Cu), titanium (Ti), and the like, and may include a single layer or a multiple layer structure. For example, the main and auxiliary source electrodes S1 and S2 and the main and auxiliary drain electrodes D1 and D2 may include a multilayer structure of Ti/Al/Ti.

The planarization layer 117 may be arranged to cover the main and auxiliary source electrodes S1 and S2 and the main and auxiliary drain electrodes D1 and D2. The planarization layer 117 may have a flat top surface such that a main pixel electrode 121 and an auxiliary pixel electrode 121' arranged thereover may be formed flat.

The planarization layer 117 may include an organic material or an inorganic material and may have a single-layer structure or a multiple-layer structure. The planarization layer 117 may include a first planarization layer 117a and a second planarization layer 117b. Accordingly, a conductive pattern such as a line may be formed between the first planarization layer 117a and the second planarization layer 117b, which may be advantageous for high integration.

The planarization layer 117 may include a general-purpose polymer, such as at least one of benzocyclobutene (BCB), polyimide, hexamethyldisiloxane (HMDSO), polymethylmethacrylate (PMMA), and polystyrene (PS), a polymer derivative having a phenolic group, an acrylic polymer, an imide-based polymer, an arylether-based polymer, an amide-based polymer, a fluorine-based polymer, a p-xylene-based polymer, and/or a vinyl alcohol-based polymer. Moreover, the planarization layer 117 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). When the planarization layer 117 is formed, after a layer is formed, chemical mechanical polishing may be performed on a top surface of the layer to provide a flat top surface.

The main and auxiliary organic light emitting diodes OLED and OLED' may be arranged over the second planarization layer 117b. The main and auxiliary pixel electrodes 121 and 121' of the main and auxiliary organic light emitting diodes OLED and OLED' may be connected to the main and auxiliary pixel circuits PC and PC' through connection electrodes CM and CM' arranged over the planarization layer 117.

The connection electrodes CM and CM' may be arranged between the first planarization layer 117a and the second planarization layer 117b. The connection electrodes CM and CM' may include a conductive material including at least one of molybdenum (Mo), aluminum (Al), copper (Cu), titanium (Ti), and the like, and may include a single layer or a multiple layer structure. For example, the connection electrodes CM and CM' may include a multiple-layer structure of Ti/Al/Ti.

The planarization layer 117 may include a third hole H3 corresponding to the transmission area TA. The third hole H3 may overlap the second hole H2. FIG. 9 illustrates that the third hole H3 is larger than the second hole H2. In an embodiment, the planarization layer 117 may be provided to cover the edge of the second hole H2 of the inorganic insulating layer IL such that the area of the third hole H3 may be less than the area of the second hole H2.

The planarization layer 117 may include a via hole for exposing any one of the main source electrode S1 and the main drain electrode D1 of the main thin film transistor TFT, and the main pixel electrode 121 may be electrically connected to the main thin film transistor TFT by contacting the main source electrode S1 or the main drain electrode D1 through the via hole. Also, the planarization layer 117 may include a via hole for exposing any one of the auxiliary source electrode S2 and the auxiliary drain electrode D2 of the auxiliary thin film transistor TFT', and the auxiliary pixel electrode 121' may be electrically connected to the auxiliary thin film transistor TFT' by contacting the auxiliary source electrode S2 or the auxiliary drain electrode D2 through the via hole.

The main pixel electrode 121 may be arranged over the planarization layer 117 of the main display area MDA, and the auxiliary pixel electrode 121' may be arranged over the planarization layer 117 of the component area CA.

The main pixel electrode 121 and the auxiliary pixel electrode 121' may include a conductive oxide, such as at least one of indium tin oxide (ITO), indium zinc oxide (IZO), zinc oxide (ZnO), indium oxide ($In_2O_3$), indium gallium oxide (IGO), and aluminum zinc oxide (AZO). The main pixel electrode 121 and the auxiliary pixel electrode 121' may include a reflection layer including at least one of silver (Ag), magnesium (Mg), aluminum (Al), platinum (Pt), palladium (Pd), gold (Au), nickel (Ni), neodymium (Nd), iridium (Ir), and chromium (Cr), or any compound thereof. For example, the main pixel electrode 121 and the auxiliary pixel electrode 121' may have a structure including layers formed of at least one of ITO, IZO, ZnO, and $In_2O_3$ over/under the reflection layer. In this case, the main pixel electrode 121 and the auxiliary pixel electrode 121' may have a stack structure of, for instance, ITO/Ag/ITO.

A pixel definition layer 119 may cover the edge of the main pixel electrode 121 and the auxiliary pixel electrode 121' over the planarization layer 117 and may include a first opening OP1 and a second opening OP2 for exposing at least a portion of the main pixel electrode 121 and the auxiliary pixel electrode 121'. The first opening OP1 and the second opening OP2 may define the emission areas of the main and auxiliary organic light emitting diodes OLED and OLED', e.g., the sizes and shapes of the main and auxiliary subpixels Pm and Pa.

The pixel definition layer 119 may increase the distance between the edge of the main and auxiliary pixel electrodes 121 and 121' and an opposite electrode 123 over the main and auxiliary pixel electrodes 121 and 121' to prevent an arc or the like from occurring at the edge of the main and auxiliary pixel electrodes 121 and 121'. The pixel definition layer 119 may be formed of an organic insulating material, such as at least one of polyimide, polyamide, acrylic resin, benzocyclobutene, hexamethyldisiloxane (HMDSO), and phenol resin by spin coating or the like.

The pixel definition layer 119 may include a fourth hole H4 located in the transmission area TA. The fourth hole H4 may overlap the second hole H2 and the third hole H3. The light transmittance in the transmission area TA may be improved by the second hole H2 to the fourth hole H4. A portion of the opposite electrode 123 described below may be arranged at the inner surface of the second hole H2 to the fourth hole H4.

In some embodiments, a spacer for preventing mask imprinting may be further arranged over the pixel definition layer 119. The spacer may be integrally formed with the pixel definition layer 119. For example, the spacer and the pixel definition layer 119 may be simultaneously formed in the same process by using a halftone mask.

A main emission layer 122b and an auxiliary emission layer 122b' may be arranged inside the first opening OP1 and the second opening OP2 of the pixel definition layer 119 to respectively correspond to the main pixel electrode 121 and the auxiliary pixel electrode 121'. The main emission layer 122b and the auxiliary emission layer 122b' may include a high molecular weight organic material or a low molecular weight organic material and may emit, for instance, red, green, blue, or white light.

An organic functional layer 122e may be arranged over and/or under the main emission layer 122b and the auxiliary emission layer 122b'. In an embodiment, the organic functional layer 122e may include a first functional layer 122a and/or a second functional layer 122c. In an embodiment, the first functional layer 122a or the second functional layer 122c may be omitted.

The first functional layer 122a may be arranged under the main emission layer 122b and the auxiliary emission layer 122b'. The first functional layer 122a may include a single layer or a multiple layer including an organic material. The first functional layer 122a may include a hole transport layer (HTL) having a single-layer structure. Alternatively, the first functional layer 122a may include a hole injection layer (HIL) and an HTL. The first functional layer 122a may be integrally formed to correspond to the main and auxiliary organic light emitting diodes OLED and OLED' included in the main display area MDA and the component area CA.

The second functional layer 122c may be arranged over the main emission layer 122b and the auxiliary emission layer 122b'. The second functional layer 122c may include a single layer or a multiple layer including an organic material. The second functional layer 122c may include an electron transport layer (ETL) and/or an electron injection layer (EIL). The second functional layer 122c may be integrally formed to correspond to the main and auxiliary organic light emitting diodes OLED and OLED' included in the main display area MDA and the component area CA.

The opposite electrode 123 may be arranged over the second functional layer 122c. The opposite electrode 123 may include a conductive material having a low work function. For example, the opposite electrode 123 may include a (semi)transparent layer including at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), and calcium (Ca), or any alloy thereof. Alternatively, the opposite electrode 123 may further include a layer such as at least one of ITO, IZO, ZnO, and $In_2O_3$ over the (semi)transparent layer including at least one of the above-noted materials. The opposite electrode 123 may be integrally formed to correspond to the main and auxiliary organic light emitting diodes OLED and OLED' included in the main display area MDA and the component area CA.

The layers from the main pixel electrode 121 to the opposite electrode 123 formed in the main display area MDA may constitute the main organic light emitting diode OLED. The layers from the auxiliary pixel electrode 121' to the opposite electrode 123 formed in the component area CA may constitute the auxiliary organic light emitting diode OLED'.

A top layer 150 including an organic material may be formed over the opposite electrode 123. The top layer 150 may be provided to protect the opposite electrode 123 and improve light extraction efficiency. The top layer 150 may include an organic material having a higher refractive index than the opposite electrode 123. Alternatively, the top layer 150 may include a stack of layers having different refractive indexes. For example, the top layer 150 may include a stack of a high refractive index layer/a low refractive index layer/a high refractive index layer. In this case, the refractive index of the high refractive index layer may be about 1.7 or more, and the refractive index of the low refractive index layer may be about 1.3 or less. The top layer 150 may further include LiF. Alternatively, the top layer 150 may further include an inorganic insulating material, such as silicon oxide ($SiO_2$) and/or silicon nitride ($SiN_x$). In an embodiment, the top layer 150 may be omitted.

The organic functional layer 122e, the opposite electrode 123, and the top layer 150 may not be arranged in the transmission area TA. For example, materials forming the organic functional layer 122e, the opposite electrode 123, and the top layer 150 are formed over the entire surface of the substrate 100, and then the organic functional layer 122e, the opposite electrode 123, and the top layer 150 formed at a portion corresponding to the transmission area TA may be removed using a laser lift-off process. Accordingly, the organic functional layer 122e, the opposite electrode 123, and the top layer 150 may not be arranged in the transmission area TA. Accordingly, the light transmittance in the transmission area TA may be significantly improved.

Figure 11:
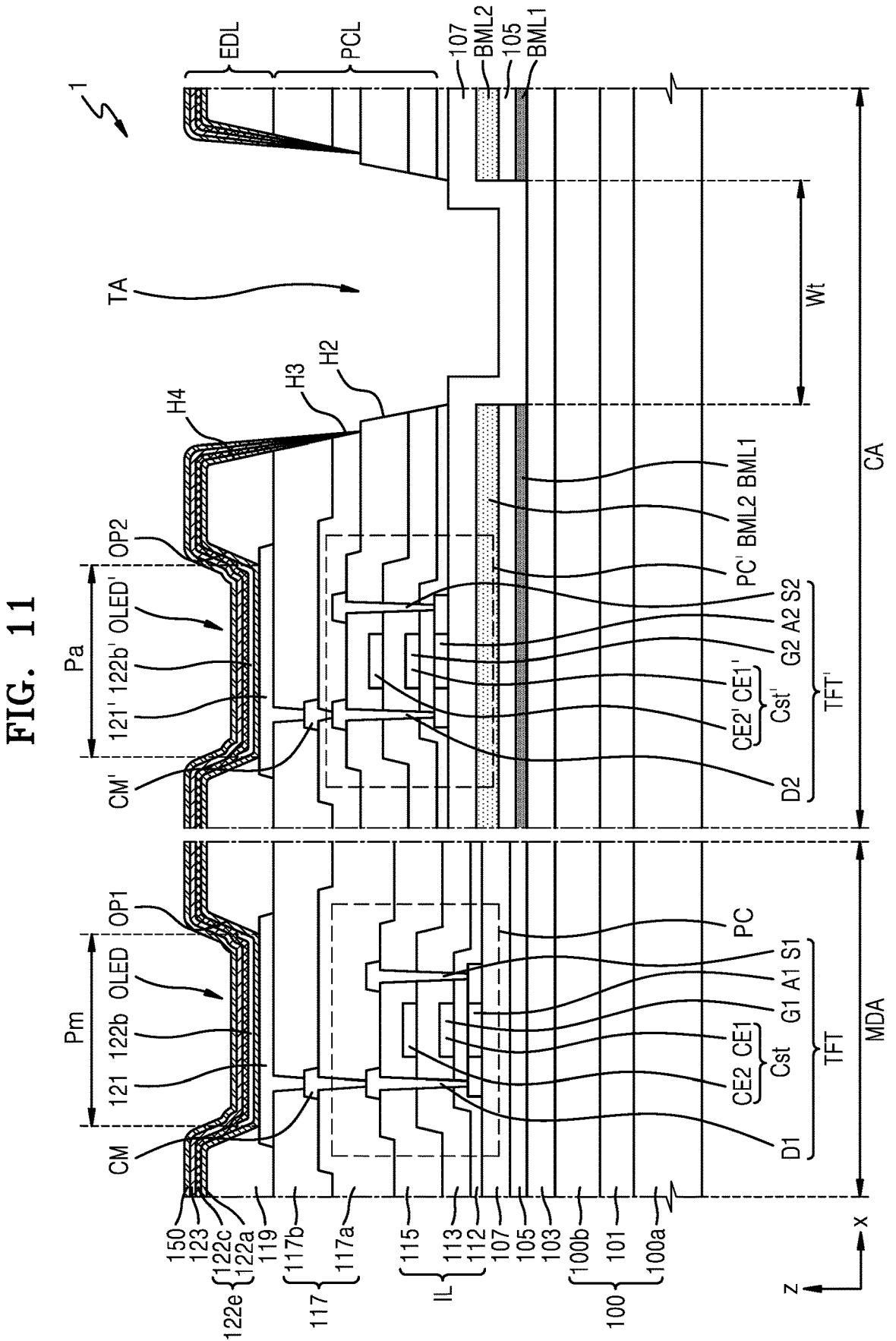
FIG. 11 is a cross-sectional view schematically illustrating a display apparatus according to an embodiment.

FIG. 11 is a cross-sectional view schematically illustrating a display apparatus according to an embodiment. The embodiment(s) of FIG. 11 is a modification of the embodiment(s) of FIG. 9 and is different from the above embodiment(s) in that a first barrier layer 105 arranged between a first bottom metal layer BML1 and a second bottom metal layer BML2 is patterned. Hereinafter, differences therebetween will be mainly described. Other configurations may be the same as or similar to those of the above embodiment(s).

Referring to FIG. 11, the first barrier layer 105 may be patterned to be arranged only between the first bottom metal layer BML1 and the second bottom metal layer BML2. In an embodiment, the first bottom metal layer BML1, the first barrier layer 105, and the second bottom metal layer BML2 may be formed and then collectively patterned. The first bottom metal layer BML1, the first barrier layer 105, and the second bottom metal layer BML2 may be formed and then collectively patterned to reduce the number of processes compared to the related art. Because the first barrier layer 105 is not arranged over the transmission area TA, the transmittance of the transmission area TA may be improved.

Figure 12:
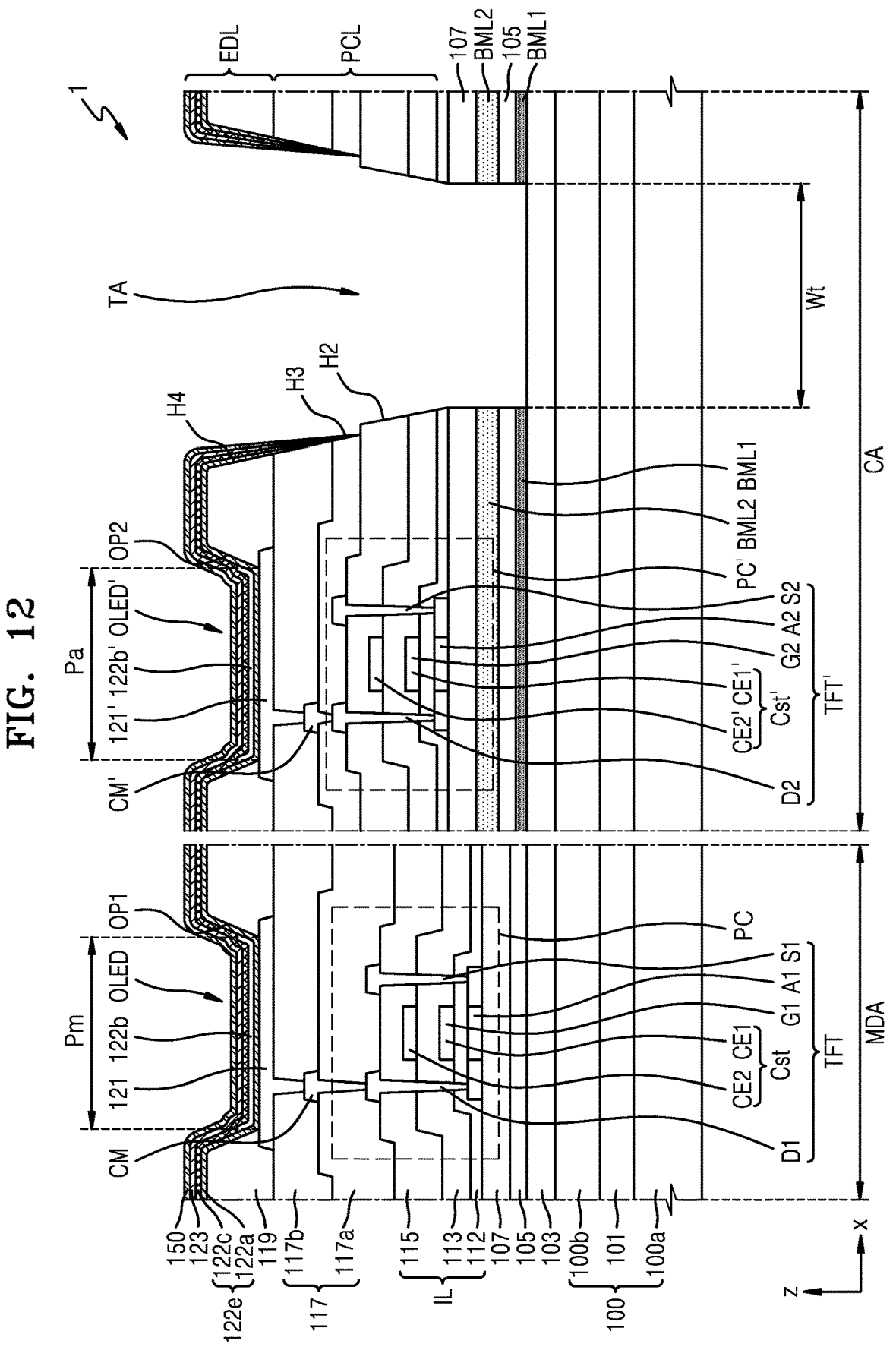
FIG. 12 is a cross-sectional view schematically illustrating a display apparatus according to an embodiment.

FIG. 12 is a cross-sectional view schematically illustrating a display apparatus according to an embodiment. The embodiment(s) of FIG. 12 is a modification of the embodiment(s) of FIG. 9 and is different from the above embodiment(s) in that a first barrier layer 105 and a second barrier layer 107 are not arranged over a transmission area TA. Hereinafter, differences therebetween will be mainly described. Other configurations may be the same as or similar to those of the above embodiment(s).

Referring to FIG. 12, the first barrier layer 105 and the second barrier layer 107 may not be arranged over the transmission area TA. Because the first barrier layer 105 and the second barrier layer 107 are not arranged over the transmission area TA, the transmittance of the transmission area TA may be improved.

In an embodiment, the second bottom metal layer BML2 may have an undercut structure. As described below, the undercut structure may be formed by etching at least a portion of the second bottom metal layer BML2 when a material forming the pixel electrode is etched.

Figure 13:
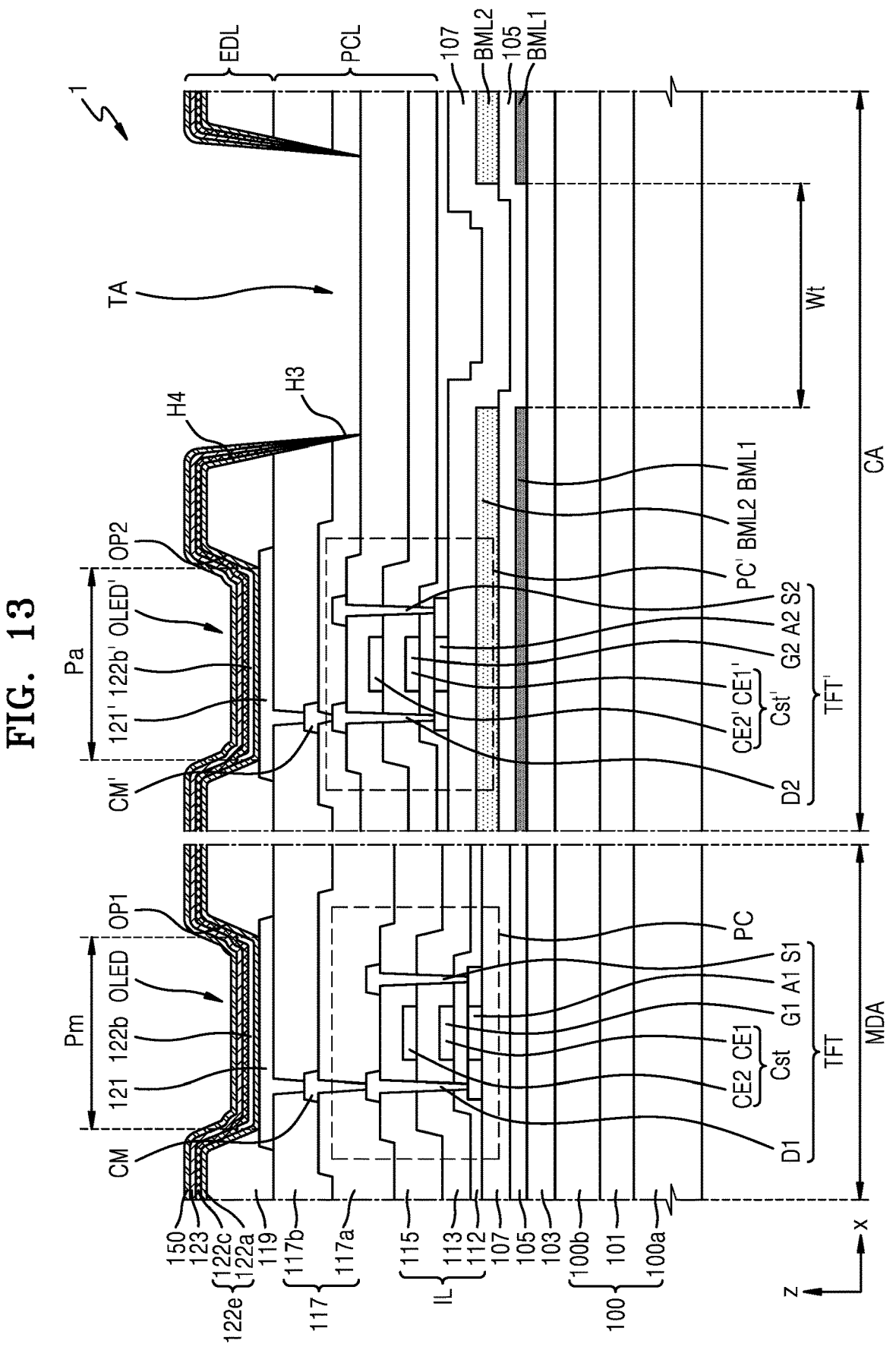
FIG. 13 is a cross-sectional view schematically illustrating a display apparatus according to an embodiment.

FIG. 13 is a cross-sectional view schematically illustrating a display apparatus according to an embodiment. The embodiment(s) of FIG. 13 is a modification of the embodiment(s) of FIG. 9 and is different from the above embodiment(s) in that an inorganic insulating layer IL is arranged over a transmission area TA. Hereinafter, differences therebetween will be mainly described. Other configurations may be the same as or similar to those of the above embodiment(s).

Referring to FIG. 13, the inorganic insulating layer IL may be arranged over the transmission area TA. The inorganic insulating layer IL may include a first insulating layer 112, a second insulating layer 113, and a third insulating layer 115. The third hole H3 provided in the planarization layer 117 may expose a portion of the upper surface of the inorganic insulating layer IL arranged over the transmission area TA.

Because the inorganic insulating layer IL is arranged over the transmission area TA, loss of the organic material forming the planarization layer 117 may be prevented.

Figure 14:
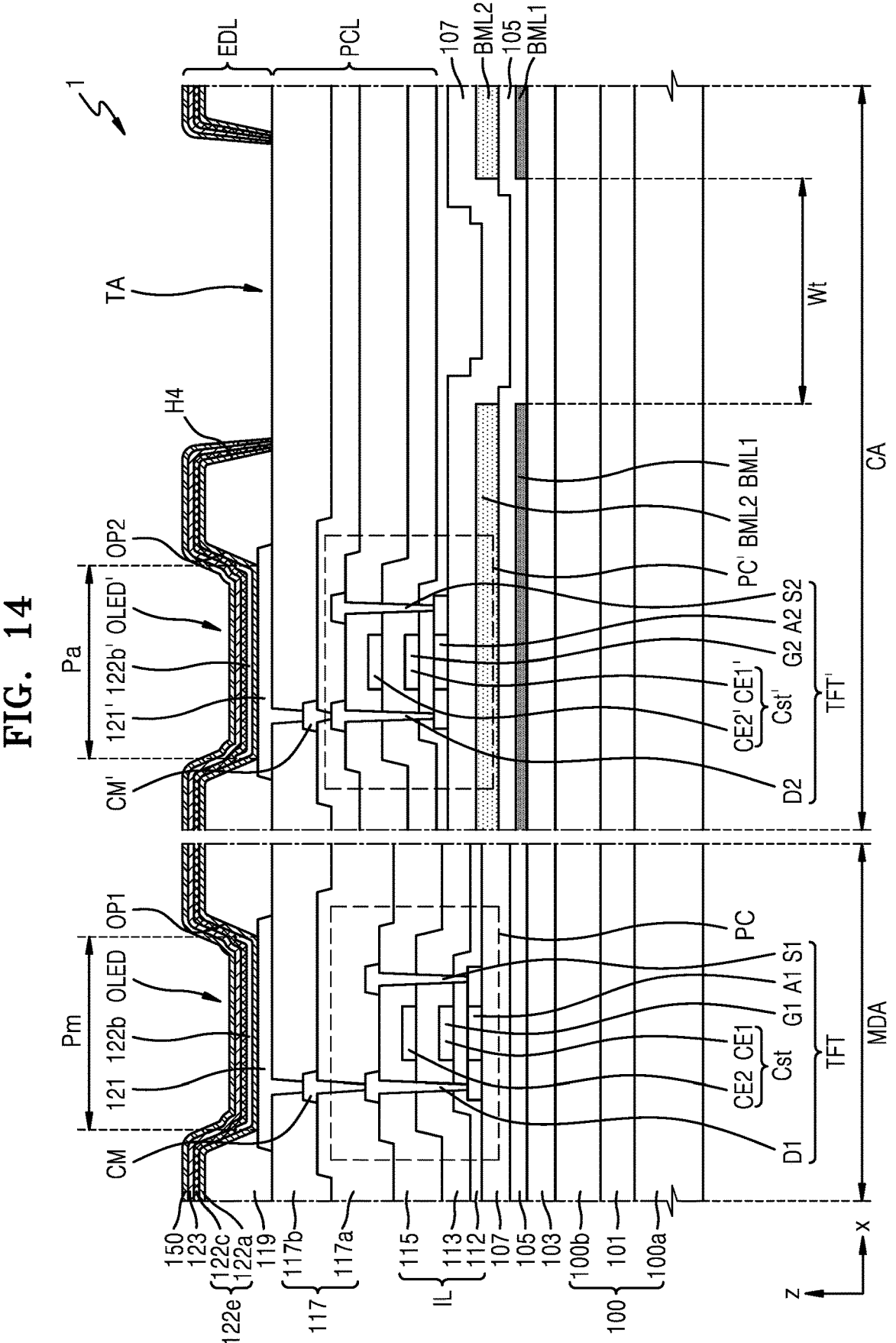
FIG. 14 is a cross-sectional view schematically illustrating a display apparatus according to an embodiment.

FIG. 14 is a cross-sectional view schematically illustrating a display apparatus according to an embodiment. The embodiment of FIG. 14 is a modification of the embodiment(s) of FIG. 9 and is different from the above embodiment(s) in that a planarization layer 117 is arranged over a transmission area TA. Hereinafter, differences therebetween will be mainly described. Other configurations may be the same as or similar to those of the above embodiment(s).

Referring to FIG. 14, the planarization layer 117 may be arranged over the transmission area TA. The planarization layer 117 may include a first planarization layer 117*a* and a second planarization layer 117*b*. The fourth hole H4 provided in the pixel definition layer 119 may expose a portion of the upper surface of the planarization layer 117 arranged over the transmission area TA.

FIGS. 15 to 20 are cross-sectional views of a display apparatus at various stages of manufacture according to various embodiments. FIGS. 15 to 20 may correspond to a portion of a process of forming the display apparatus as described in association with FIGS. 9 to 14.

Hereinafter, a method of manufacturing a display apparatus will be sequentially described with reference to FIGS. 15 to 20.

A method of manufacturing a display apparatus according to an embodiment may include an operation of preparing a substrate 100 including a main display area MDA, a component area CA including a transmission area TA, and a peripheral area DPA around the main display area MDA; an operation of forming a first bottom metal layer BML1, a first barrier layer 105, and a second bottom metal layer BML2 over the upper surface of the substrate 100 of the component area CA; an operation of forming a conductive material layer 121M over the upper surface of the substrate 100 of the main display area MDA and the second bottom metal layer BML2 of the component area CA; an operation of forming main and auxiliary pixel electrodes 121 and 121' by removing at least a portion of the conductive material layer 121M, an operation of removing the second bottom metal layer BML2 corresponding to the transmission area TA; an operation of forming an organic functional layer 122*e*, an opposite electrode 123, and a top layer 150 over the entire surface of the substrate 100 to cover the main and auxiliary pixel electrodes 121 and 121' and the first bottom metal layer BML1; and an operation of irradiating a laser to the lower surface opposite to the upper surface of the substrate 100 corresponding to the transmission area TA.

Figure 15:
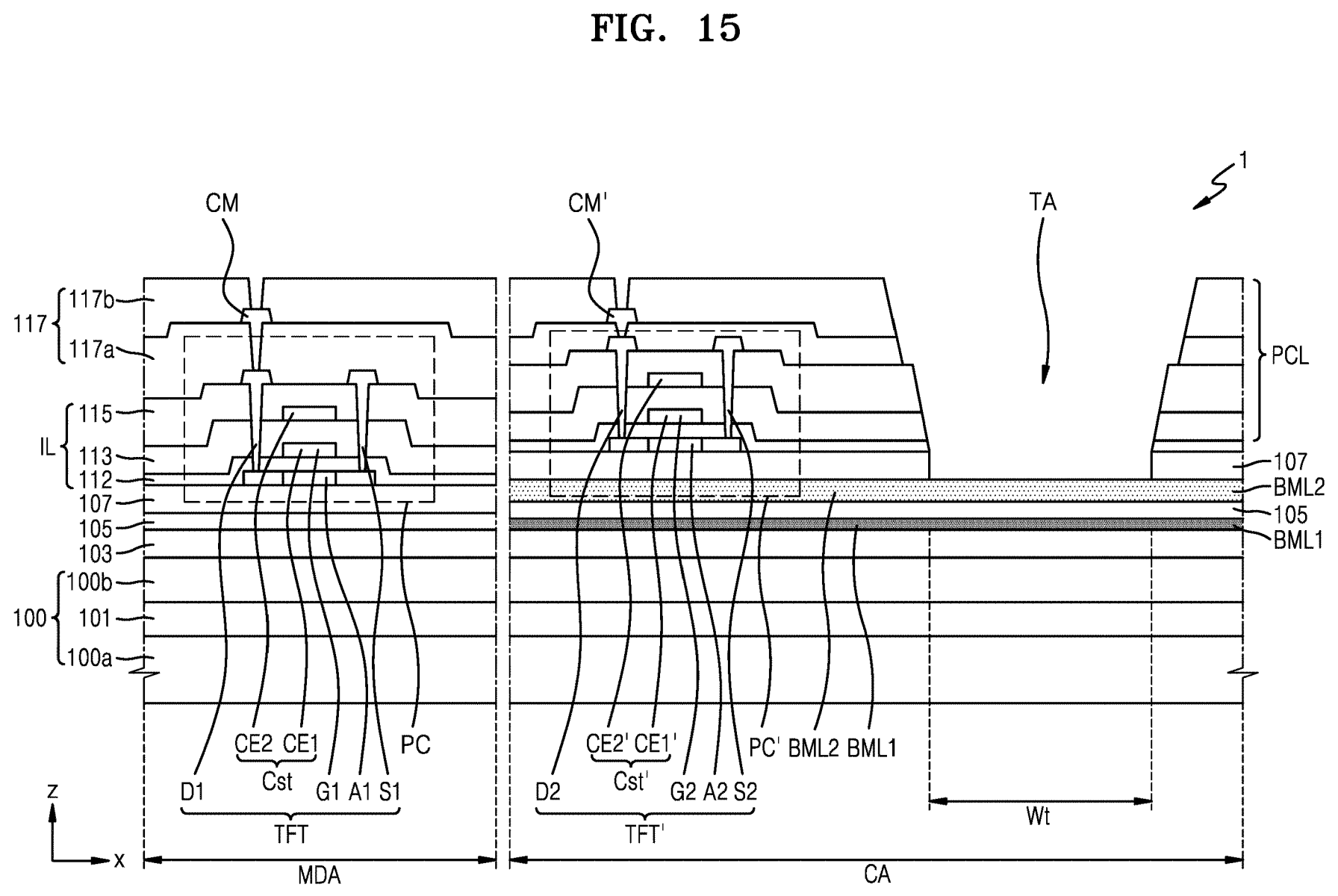

Referring to FIG. 15, an operation of preparing a substrate 100 including a main display area MDA, a component area CA including a transmission area TA, and a peripheral area DPA around the main display area MDA, and an operation of forming a first bottom metal layer BML1, a first barrier layer 105, and a second bottom metal layer BML2 over the upper surface of the substrate 100 of the component area CA may be performed.

In the operation of forming the first bottom metal layer BML1, the first barrier layer 105, and the second bottom metal layer BML2 over the upper surface of the substrate 100 of the component area CA, the first bottom metal layer BML1 may be formed to have a first thickness t1 (see FIG. 10) from a fourth barrier layer 103, and the second bottom metal layer BML2 may be formed to have a second thickness t2 (see FIG. 10) from the first barrier layer 105. The second thickness t2 of the second bottom metal layer BML2 may be greater than the first thickness t1 of the first bottom metal layer BML1. For example, the first thickness t1 may be about 30 Å to about 100 Å and the second thickness t2 may be about 1,000 Å to about 3,500 Å.

In an embodiment, the first barrier layer 105 may be between the first bottom metal layer BML1 and the second bottom metal layer BML2 formed over the transmission area TA. The first barrier layer 105 may have a third thickness t3 from the first bottom metal layer BML1. For example, the third thickness t3 may be about 500 Å to about 1,500 Å. In an embodiment, the first barrier layer 105 over the transmission area TA may be removed through a separate process, and thus, the second bottom metal layer BML2 may be directly formed on the first bottom metal layer BML1.

After the operation of forming the first bottom metal layer BML1, the first barrier layer 105, and the second bottom metal layer BML2 over the upper surface of the substrate 100 of the component area CA, an operation of forming a main pixel circuit PC over the upper surface of the substrate 100 of the main display area MDA and an auxiliary pixel circuit PC' over the second bottom metal layer BML2 of the component area CA may be performed.

The main pixel circuit PC may include a main thin film transistor TFT and a main storage capacitor Cst. the auxiliary pixel circuit PC' may include an auxiliary thin film transistor TFT' and an auxiliary storage capacitor Cst'.

The first bottom metal layer BML1 and the second bottom metal layer BML2 arranged over the component area CA may overlap the auxiliary pixel circuit PC'. The first bottom metal layer BML1 and the second bottom metal layer BML2 may be arranged under the auxiliary pixel circuit PC' to prevent the degradation of the characteristics of the auxiliary thin film transistor TFT' by the light emitted from a component or the like.

A planarization layer 117 may be formed over the main pixel circuit PC and the auxiliary pixel circuit PC'. The planarization layer 117 may be formed to cover the main pixel circuit PC and the auxiliary pixel circuit PC'.

Figure 16:
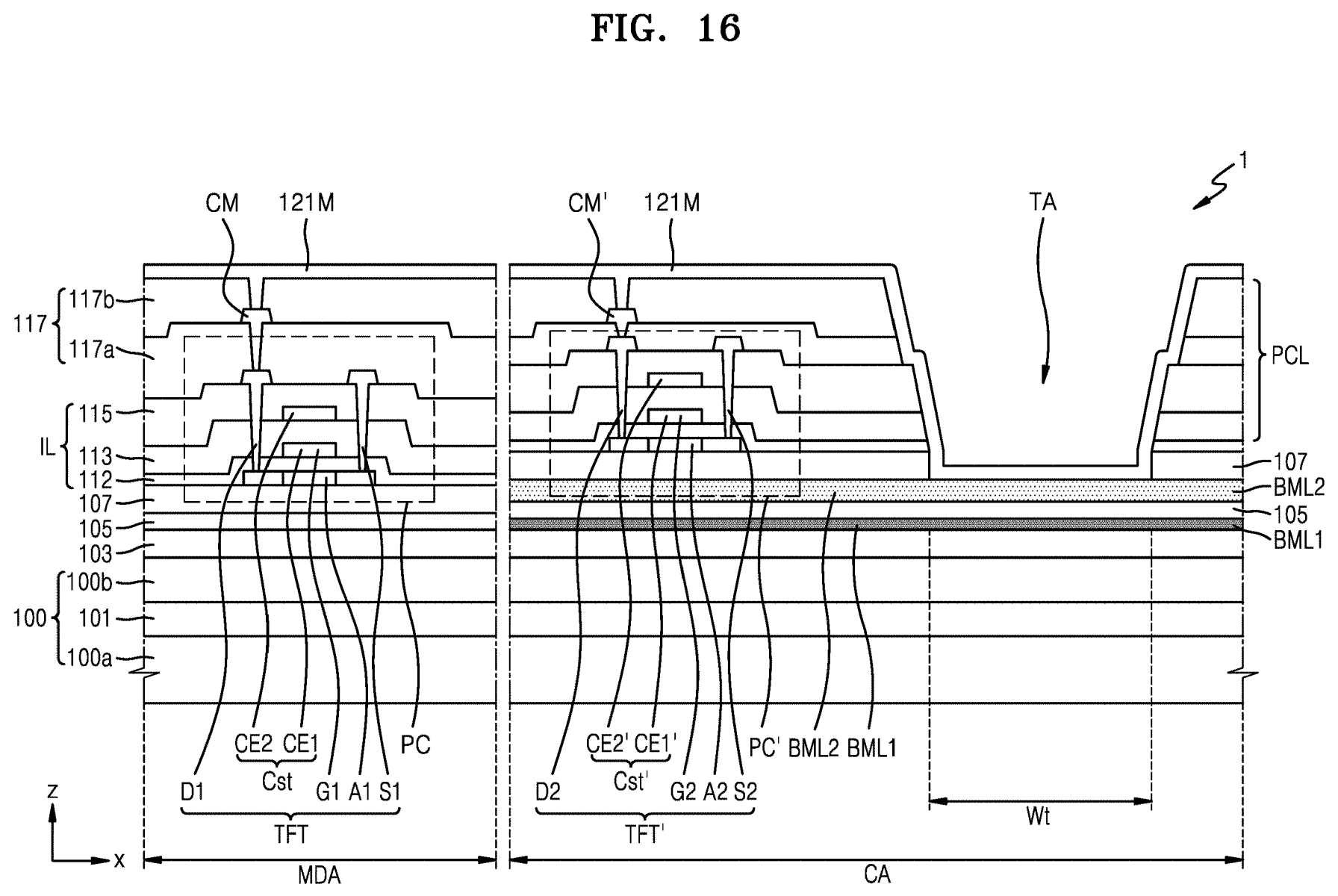

Referring to FIG. 16, after the operation of forming the main pixel circuit PC over the upper surface of the substrate 100 of the main display area MDA and the auxiliary pixel circuit PC' over the second bottom metal layer BML2 of the component area CA, an operation of forming a conductive material layer 121M over the upper surface of the substrate 100 of the main display area MDA and the second bottom metal layer BML2 of the component area CA may be performed.

The conductive material layer 121M may be formed over the entire surface of the substrate 100. For instance, the conductive material layer 121M may be formed over the planarization layer 117 of the main display area MDA and the component area CA and over the second bottom metal layer BML2 of the transmission area TA. The conductive material layer 121M may include a reflection layer including at least one of a conductive oxide, such as at least one of indium tin oxide (ITO), indium zinc oxide (IZO), zinc oxide (ZnO), indium oxide (In$_2$O$_3$), indium gallium oxide (IGO), and aluminum zinc oxide (AZO), or at least one of silver (Ag), magnesium (Mg), aluminum (Al), platinum (Pt), palladium (Pd), gold (Au), nickel (Ni), neodymium (Nd), iridium (Ir), and chromium (Cr), or any compound thereof.

Figure 17:
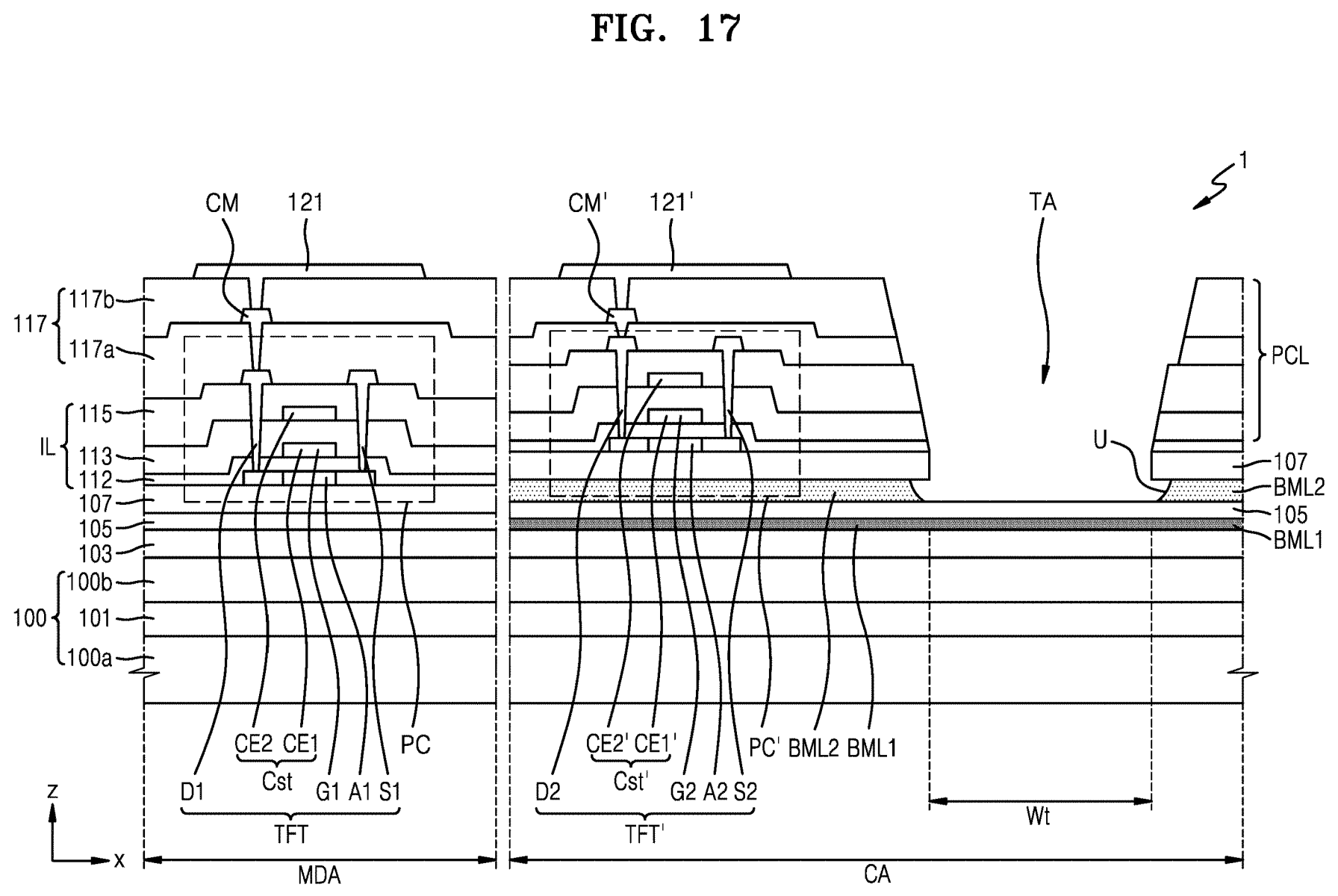

Referring to FIG. 17, after the operation of forming the conductive material layer 121M over the upper surface of the substrate 100 of the main display area MDA and the second bottom metal layer BML2 of the component area CA, an operation of forming main and auxiliary pixel electrodes 121 and 121' by removing at least a portion of the conductive material layer 121M and removing the second bottom metal layer BML2 corresponding to the transmission area TA may be performed.

In the operation of forming the main and auxiliary pixel electrodes 121 and 121' by removing at least a portion of the conductive material layer 121M and removing the second bottom metal layer BML2 corresponding to the transmission area TA, the main and auxiliary pixel electrodes 121 and 121' may be formed by etching the conductive material layer 121M formed over the entire surface of the substrate 100. For instance, the main pixel electrode 121 and the auxiliary pixel electrode 121' may be formed by wet-etching the conductive material layer 121M arranged over the main display area MDA and the component area CA.

When the conductive material layer 121M formed over the entire surface of the substrate 100 is etched, the second bottom metal layer BML2 formed over the transmission area TA may also be etched. The second bottom metal layer BML2 formed over the transmission area TA may be removed by wet etching. An undercut U structure may be formed in the second bottom metal layer BML2 by isotropic etching.

In an embodiment, because the second bottom metal layer BML2 formed over the transmission area TA is removed by wet etching, the first barrier layer 105 formed under the second bottom metal layer BML2 over the transmission area TA may be exposed to the outside. In an embodiment, the first barrier layer 105 formed under the second bottom metal layer BML2 over the transmission area TA may be etched and removed together when the second bottom metal layer BML2 formed over the transmission area TA is removed. In the above case, the upper surface of the first bottom metal layer BML1 formed under the second bottom metal layer BML2 over the transmission area TA may be exposed to the outside.

Figure 18:
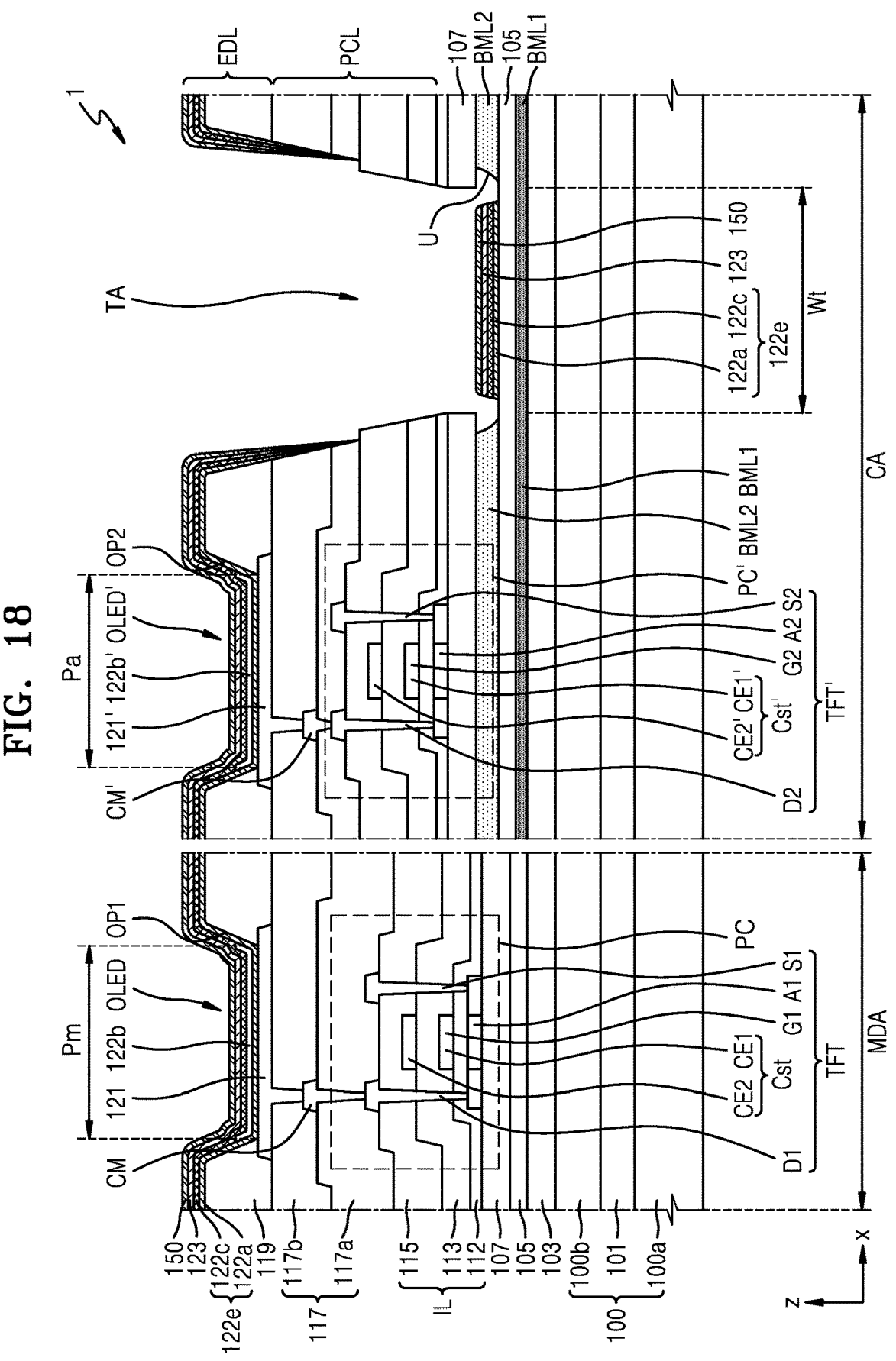

Referring to FIG. 18, after the operation of forming the main and auxiliary pixel electrodes 121 and 121' by removing at least a portion of the conductive material layer 121M and removing the second bottom metal layer BML2 corresponding to the transmission area TA, an operation of forming an organic functional layer 122e, an opposite electrode 123, and a top layer 150 over the entire surface of the substrate 100 to cover the main and auxiliary pixel electrodes 121 and 121' and the first bottom metal layer BML1 may be performed.

The organic functional layer 122e, the opposite electrode 123, and the top layer 150 may be integrally formed to correspond to the main and auxiliary organic light emitting diodes OLED and OLED' included in the main display area MDA and the component area CA. In an embodiment, the organic functional layer 122e, the opposite electrode 123, and the top layer 150 may also be formed over the upper surface of the first barrier layer 105 where the upper surface of the transmission area TA is exposed to the outside. In an embodiment, when the first barrier layer 105 over the transmission area TA is removed, the organic functional layer 122e, the opposite electrode 123, and the top layer 150 may be formed over the upper surface of the first bottom metal layer BML1 where the upper surface on the transmission area TA is exposed to the outside.

Materials forming the organic functional layer 122e, the opposite electrode 123, and the top layer 150 may be formed thin or may not be formed at the inner surface of an inorganic insulating layer IL, a planarization layer 117, and a pixel definition layer 119 from which at least a portion has been removed corresponding to the transmission area TA.

Figure 19:
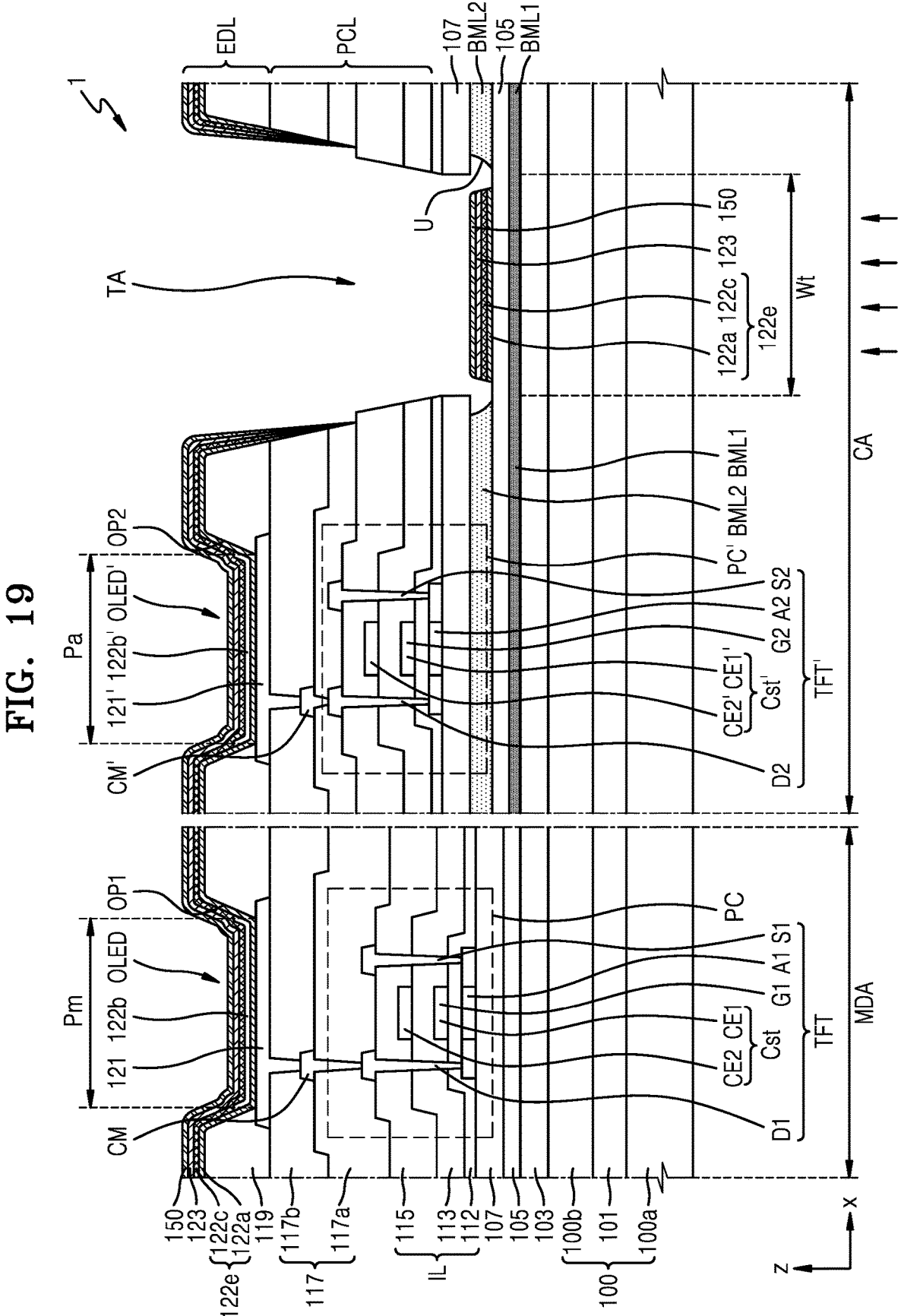

Referring to FIG. 19, after the operation of forming the organic functional layer 122e, the opposite electrode 123, and the top layer 150 over the entire surface of the substrate 100 to cover the main and auxiliary pixel electrodes 121 and 121' and the first bottom metal layer BML1, an operation of irradiating a laser to the lower surface opposite to the upper surface of the substrate 100 corresponding to the transmission area TA may be performed.

When the organic functional layer 122e, the opposite electrode 123, and the top layer 150 are formed over the transmission area TA, because the transmittance of the transmission area TA may be significantly reduced, a process of removing the organic functional layer 122e, the opposite electrode 123, and the top layer 150 formed over the first bottom metal layer BML1 over the transmission area TA may be performed to improve the transmittance of the transmission area TA. For example, the organic functional layer 122e, the opposite electrode 123, and the top layer 150 formed over the transmission area TA may be removed by a laser.

In the case of using a laser to remove the organic functional layer 122e, the opposite electrode 123, and the top layer 150 formed over the transmission area TA, because only the opposite electrode 123 and the top layer 150 are removed and the organic functional layer 122e remains without being removed, there is a problem in that the transmittance of the transmission area TA is reduced.

Also, in the case of leaving a portion of the conductive material layer forming the pixel electrode over the transmission area TA and using the remaining conductive material layer as a sacrificial layer and using a laser to remove the organic functional layer 122e, the opposite electrode 123, and the top layer 150 formed thereover, there is a problem in that a portion of the conductive material layer remains on the sidewall of the transmission area TA and particles are formed. For example, when the conductive material layer includes silver (Ag), there is a problem in that a low-energy laser beam should be irradiated due to a low melting point of silver (Ag) and silver particles are formed.

The first bottom metal layer BML1 and the second bottom metal layer BML2 may be arranged over the component area CA excluding the transmission area TA to prevent the characteristics of the auxiliary thin film transistor TFT' from degrading due to the light emitted from the component or the like and to prevent the light emitted from or directed to the component or the like from diffracting through a narrow gap between the lines connected to the auxiliary pixel circuit PC'. However, when the thicknesses of the first bottom metal layer BML1 and the second bottom metal layer BML2 are small, it may be difficult to sufficiently achieve effects for preventing the characteristics of the auxiliary thin film transistor TFT' from being degraded and preventing the light from being diffracted through a narrow gap between the lines connected to the auxiliary pixel circuit PC'.

When the organic functional layer 122e, the opposite electrode 123, and the top layer 150 formed over the transmission area TA are removed through a laser lift-off process by using the sacrificial layer, when the thickness of the sacrificial layer is great, there may be a problem, such as an increase in the laser irradiation time.

Embodiments described herein may solve various problems, such as the above problems, and may prevent the degradation of the thin film transistors and the diffraction of light between the lines through the first bottom metal layer BML1 and the second bottom metal layer BML2 formed in the component area CA excluding the transmission area TA by providing the bottom metal layer as the first bottom metal layer BML1 and the second bottom metal layer BML2 and providing the second bottom metal layer BML2 to be thicker than the first bottom metal layer BML1.

Because the second bottom metal layer BML2 over the transmission area TA is etched together in the process of etching the conductive material layer 121M, and thus, the first bottom metal layer BML1 and the first barrier layer 105 exist over the transmission area TA, the organic functional layer 122e, the opposite electrode 123, and the top layer 150 formed over the transmission area TA may be removed by irradiating a laser to the lower surface of the substrate 100 using the first bottom metal layer BML1, which is thinner than the second bottom metal layer BML2, as a sacrificial layer.

When the first barrier layer 105 over the transmission area TA is etched together in the process of etching the conductive material layer or is previously removed through a separate process, because only the first bottom metal layer BML1 exists over the transmission area TA, the organic functional layer 122e, the opposite electrode 123, and the top layer 150 formed over the transmission area TA may be removed by irradiating a laser to the lower surface of the substrate 100 using the first bottom metal layer BML1, which is thinner than the second bottom metal layer BML2, as a sacrificial layer.

Figure 20:
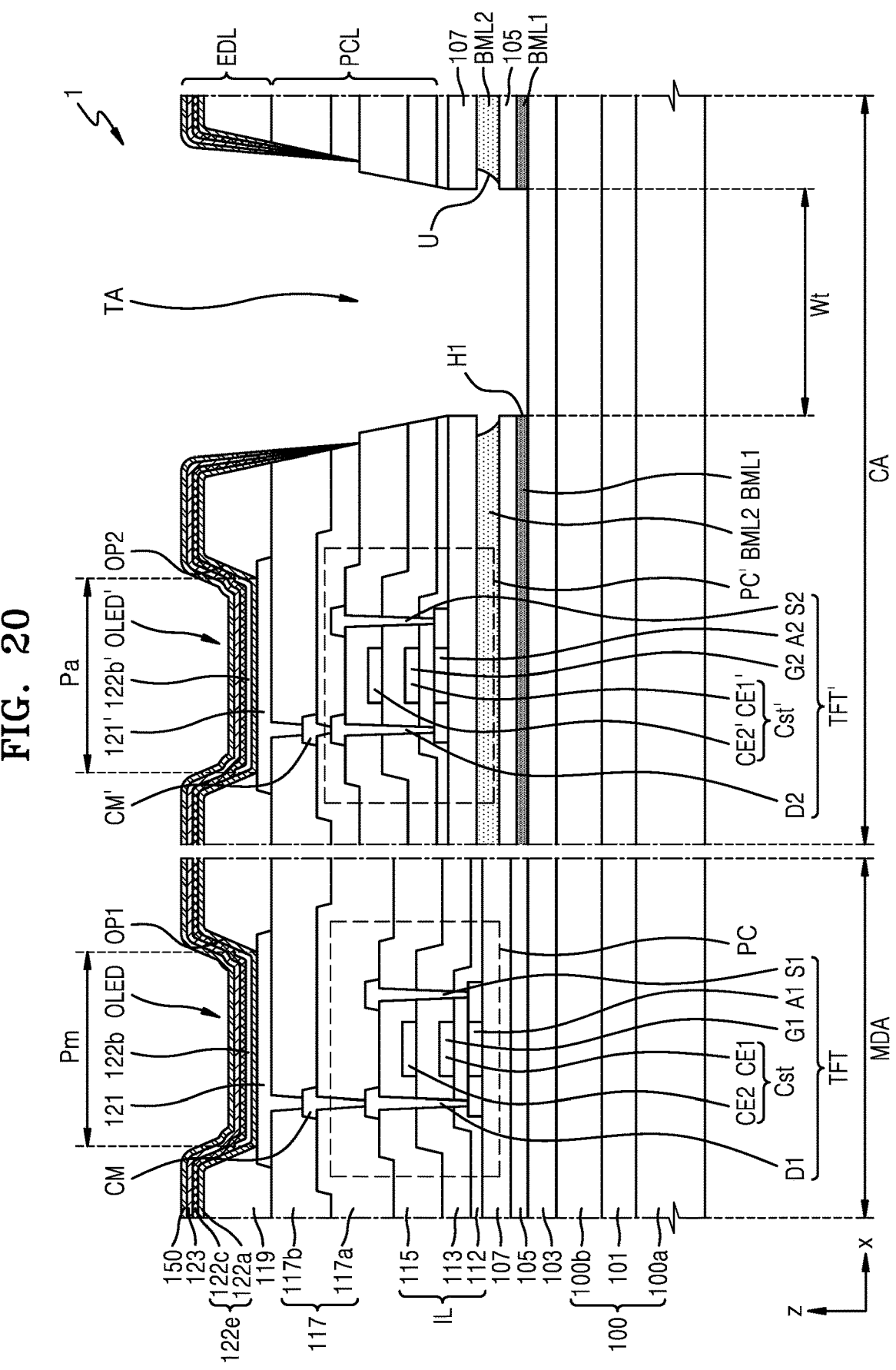

As illustrated in FIG. 20, in an embodiment, while the first bottom metal layer BML1 and the first barrier layer 105 formed over the transmission area TA are removed through a laser lift-off process, the organic functional layer 122e, the opposite electrode 123, and the top layer 150 formed thereover may be removed together. In an embodiment, when the first barrier layer 105 is previously removed through another process, while the first bottom metal layer BML1 formed over the transmission area TA is removed through a laser lift-off process, the organic functional layer 122e, the opposite electrode 123, and the top layer 150 formed thereover may be removed together. Because the organic functional layer 122e, the opposite electrode 123, and the top layer 150 formed over the transmission area TA may be removed, the transmittance of the transmission area TA may be improved.

As the first bottom metal layer BML1 over the transmission area TA is removed, the first hole H1 may be defined in the first bottom metal layer BML1 over the component area CA.

As described, according to various embodiments, it may be possible to implement a display apparatus including a component area in which various types of components may be arranged in a display area. However, the scope of the disclosure is not limited to these effects.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
a substrate comprising a main display area and a component area, the component area comprising a transmission area and an auxiliary display area adjacent to the transmission area, wherein a density of main pixels associated with the main display area is different from a density of auxiliary pixels associated with the component area;
main pixel circuits and main light-emitting elements arranged on the main display area in correspondence with the main pixels, the main pixel circuits being electrically connected to corresponding main light-emitting elements among the main light-emitting elements;
auxiliary pixel circuits and auxiliary light-emitting elements arranged on the auxiliary display area in correspondence with the auxiliary pixels, the auxiliary pixel circuits being different from the main pixel circuits and being electrically connected to corresponding auxiliary light-emitting elements among the auxiliary light-emitting elements;
a first bottom metal layer arranged between the substrate and an auxiliary pixel circuit among the auxiliary pixel circuits in a region overlapping the auxiliary display area;
a second bottom metal layer arranged between the first bottom metal layer and the auxiliary pixel circuit in the region overlapping the auxiliary display area;
a first barrier layer arranged between the first bottom metal layer and the second bottom metal layer; and
a second barrier layer arranged over the second bottom metal layer,
wherein, in a view perpendicular to an upper surface of the substrate, at least one of the first bottom metal layer and the second bottom metal layer is spaced apart from the main display area.

2. The display apparatus of claim 1, wherein:
the first bottom metal layer has a first thickness; and
the second bottom metal layer has a second thickness, the second thickness being greater than the first thickness.

3. The display apparatus of claim 2, wherein:

the first thickness is in a range of about 30 angstroms (Å) to about 100 Å; and the second thickness is in a range of about 1,000 Å to about 3,500 Å.

4. The display apparatus of claim 1, wherein:

the first barrier layer is electrically insulative and has a third thickness; and the third thickness is in a range of about 500 angstroms (Å) to about 1,500 Å.

5. The display apparatus of claim 4, wherein:

the second barrier layer is electrically insulative and has a fourth thickness; and the fourth thickness is greater than the third thickness.

6. The display apparatus of claim 5, wherein the fourth thickness is in a range of about 1,000 Å to about 3,000 Å.

7. The display apparatus of claim 1, further comprising:

a protection layer underlying a lower surface of the substrate opposing the upper surface of the substrate, the protection layer comprising an opening, wherein:

both the auxiliary display area and the transmission area overlap the opening, and the first bottom metal layer comprises a first hole corresponding to the transmission area and overlapping the opening.

8. The display apparatus of claim 1, wherein a transmissivity of the first bottom metal layer is greater than a transmissivity of the second bottom metal layer.

9. The display apparatus of claim 1, wherein the first barrier layer is arranged only between the first bottom metal layer and the second bottom metal layer.

10. The display apparatus of claim 1, wherein the second bottom metal layer comprises an undercut structure.

11. The display apparatus of claim 1, wherein the first bottom metal layer and the second bottom metal layer at least partially overlap the auxiliary pixel circuit.

12. The display apparatus of claim 1, wherein:

the auxiliary light-emitting elements are arranged between an image display surface of the display apparatus and the upper surface of the substrate; and in response to propagation of light from below a lower surface of the substrate towards the image display surface, a first portion of the light reflected from the first bottom metal layer towards the lower surface of the substrate and a second portion of the light reflected from the second bottom metal layer towards the lower surface of the substrate destructively interfere with each other in a region underlying each of the second bottom metal layer, the first bottom metal layer, and the lower surface of the substrate.

13. The display apparatus of claim 1, wherein:

the substrate comprises a first substrate and a second substrate arranged over the first substrate; and the first substrate and the second substrate include a polymer resin.

14. The display apparatus of claim 13, further comprising:

a third barrier layer arranged between the first substrate and the second substrate; and a fourth barrier layer arranged over the second substrate, wherein the first bottom metal layer is disposed directly on the fourth barrier layer.

15. The display apparatus of claim 1, wherein the second bottom metal layer is disposed directly on the first barrier layer.

16. An electronic apparatus comprising:

a display apparatus comprising a substrate, the substrate comprising a main display area and a component area, the component area comprising a transmission area, wherein a density of main pixels associated with the main display area is different from a density of auxiliary pixels associated with the component area; and a component comprising a sensor facing a lower surface of the substrate, the transmission area overlapping the sensor, wherein:

the display apparatus comprises:

main pixel circuits and main light-emitting elements arranged on an upper surface of the substrate in association with the main display area and in correspondence with the main pixels, the upper surface of the substrate opposing the lower surface of the substrate in a first direction, the main pixel circuits respectively comprising a main transistor electrically connected to a corresponding main light-emitting element among the main light-emitting elements;

auxiliary pixel circuits and auxiliary light-emitting elements arranged on the upper surface of the substrate in association with the component area and in correspondence with the auxiliary pixels, the auxiliary pixel circuits being different from the main pixel circuits, the auxiliary pixel circuits respectively comprising an auxiliary transistor electrically connected to a corresponding auxiliary light-emitting element among the auxiliary light-emitting elements;

a first bottom metal layer arranged between the upper surface of the substrate and an active layer of the auxiliary transistor among auxiliary transistors in a region overlapping the component area;

a second bottom metal layer arranged between the first bottom metal layer and the active layer of the auxiliary transistor in the region overlapping the component area;

a first barrier layer arranged between the first bottom metal layer and the second bottom metal layer; and a second barrier layer arranged over the second bottom metal layer, and in a view in the first direction, at least one of the first bottom metal layer and the second bottom metal layer is spaced apart from an active layer of the main transistor among main transistors in a second direction perpendicular to the first direction.

17. The electronic apparatus of claim 16, wherein:

the first bottom metal layer has a first thickness;

the second bottom metal layer has a second thickness, the second thickness being greater than the first thickness;

the first thickness is about 30 angstroms (Å) to about 100 Å; and the second thickness is about 1,000 Å to about 3,500 Å.

18. The electronic apparatus of claim 16, wherein:

the first barrier layer has a third thickness; and the third thickness is in a range of about 500 angstroms (Å) to about 1,500 Å.

19. The electronic apparatus of claim 16, further comprising:

a protection layer underlying the lower surface of the substrate and comprising an opening, wherein:

both the corresponding auxiliary light-emitting element and the transmission area respectively overlap the opening in the first direction; and the first bottom metal layer comprises a first hole corresponding to the transmission area and overlapping the opening in the first direction.

20. The electronic apparatus of claim 16, wherein a transmissivity of the first bottom metal layer is greater than a transmissivity of the second bottom metal layer.

\* \* \* \* \*